United States Patent [19]

Krepps, Jr.

[11] 4,128,820
[45] Dec. 5, 1978

[54] COMBINATION VHF AND UHF TUNER ARRANGEMENT

[75] Inventor: James E. Krepps, Jr., Bloomington, Ind.

[73] Assignee: Sarkes Tarzian, Inc., Bloomington, Ind.

[21] Appl. No.: 796,848

[22] Filed: May 16, 1977

[51] Int. Cl.² ............................................. H03J 5/30
[52] U.S. Cl. ...................................... 334/1; 325/459; 325/465; 334/47; 334/50
[58] Field of Search ..................... 334/1, 2, 47, 50, 51, 334/56; 325/459, 461, 462, 465

[56] References Cited

U.S. PATENT DOCUMENTS

| | | | |
|---|---|---|---|
| 3,210,700 | 10/1965 | Krepps, Jr. et al. | 334/50 |
| 3,593,226 | 7/1971 | Weigel | 334/2 X |
| 3,757,227 | 9/1973 | Weigel | 325/462 |

Primary Examiner—Paul L. Gensler
Attorney, Agent, or Firm—Mason, Kolehmainen, Rathburn & Wyss

[57] ABSTRACT

In a VHF tuner a stator bar switching arrangement is provided which is particularly suitable for use in combination VHF-UHF tuners. A movable switching member positioned on the main stator bar of a turret type VHF tuner is moved between fixed contacts on the stator bar by engagement with a projection on each of the tuning sticks of the turret in each VHF channel receiving position of the main selector shaft. Various switching arrangements are provided for VHF-UHF operation.

11 Claims, 32 Drawing Figures

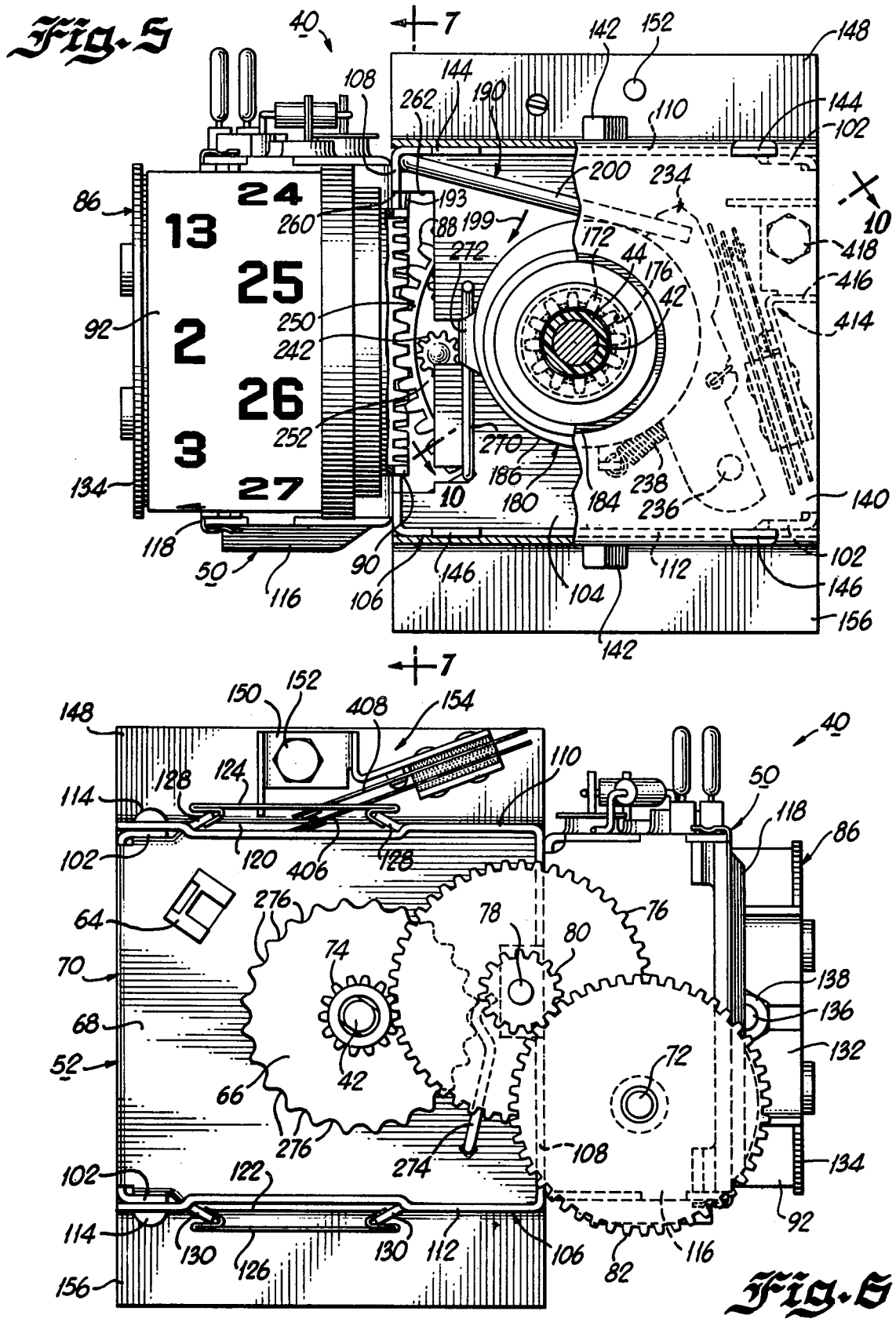

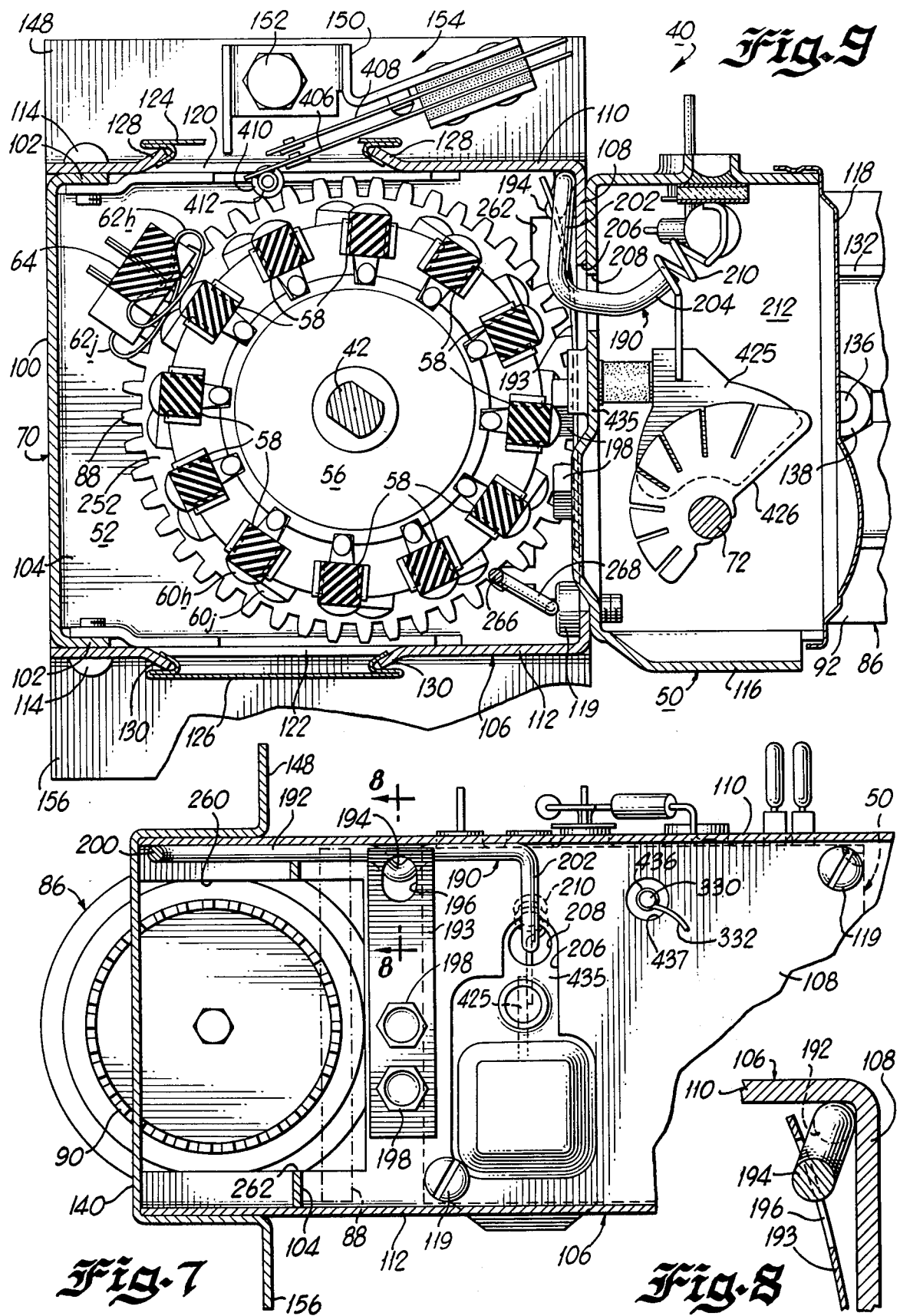

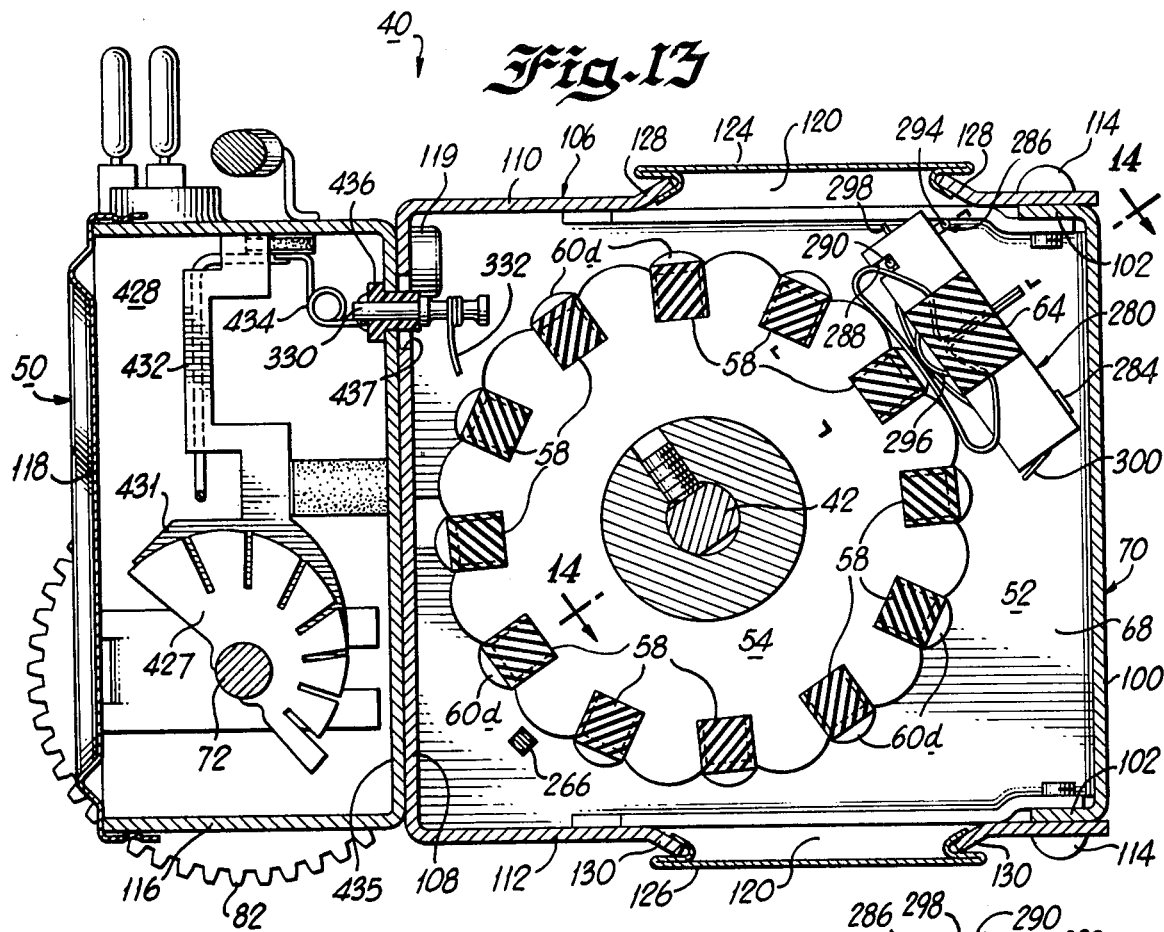
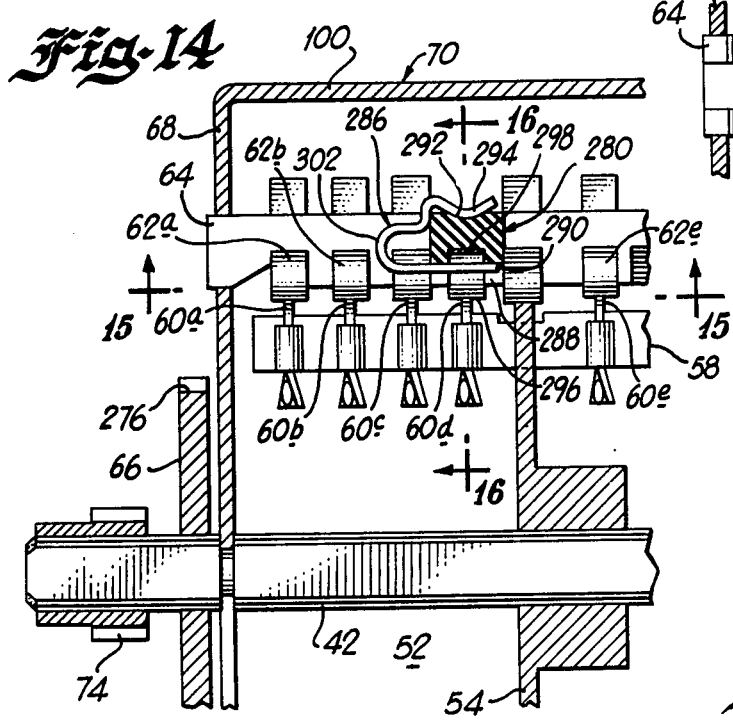
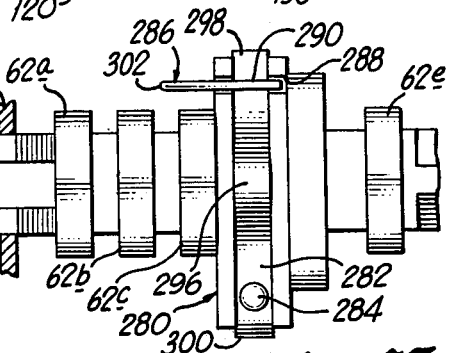
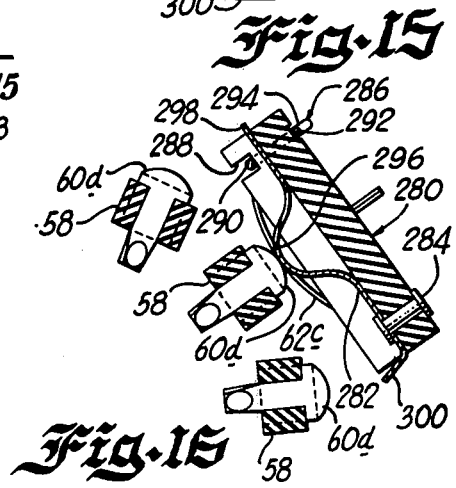

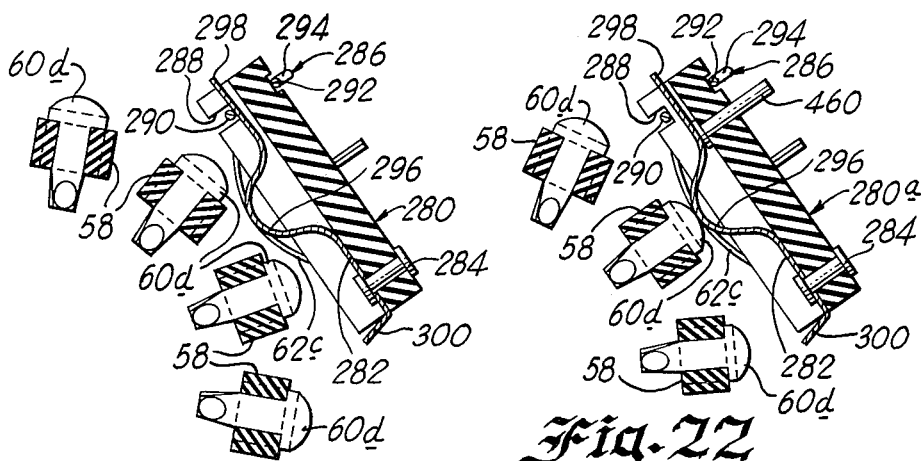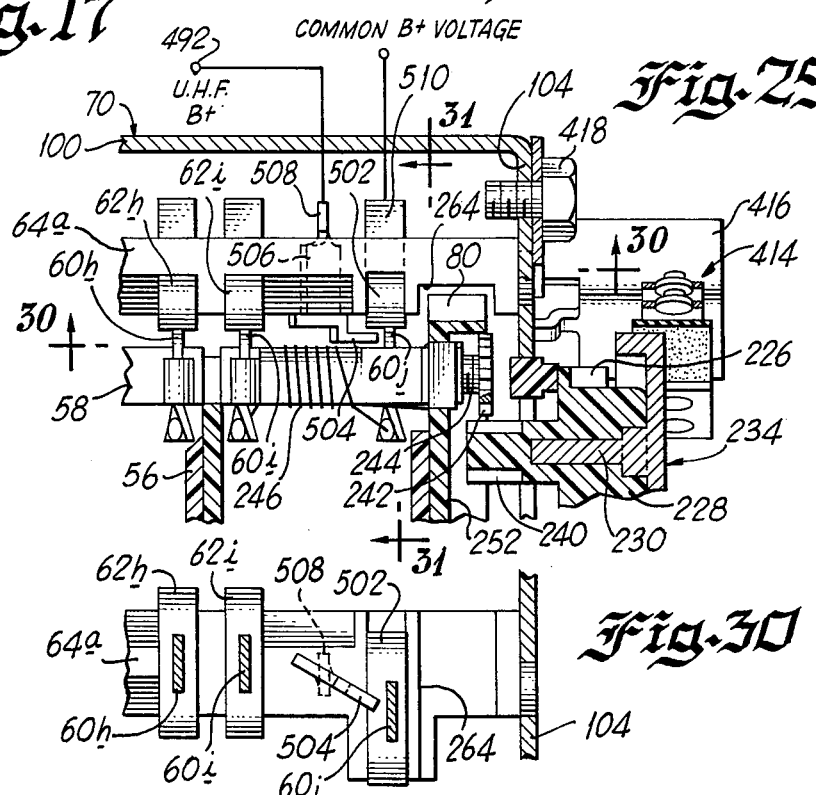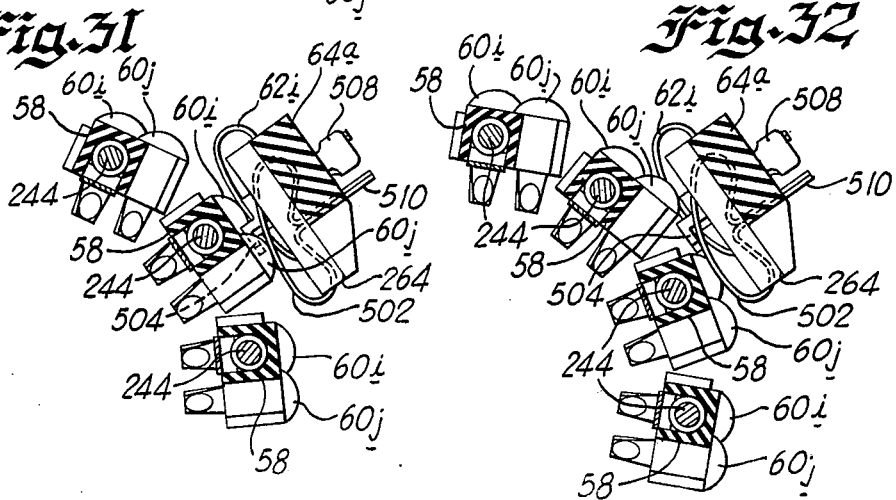

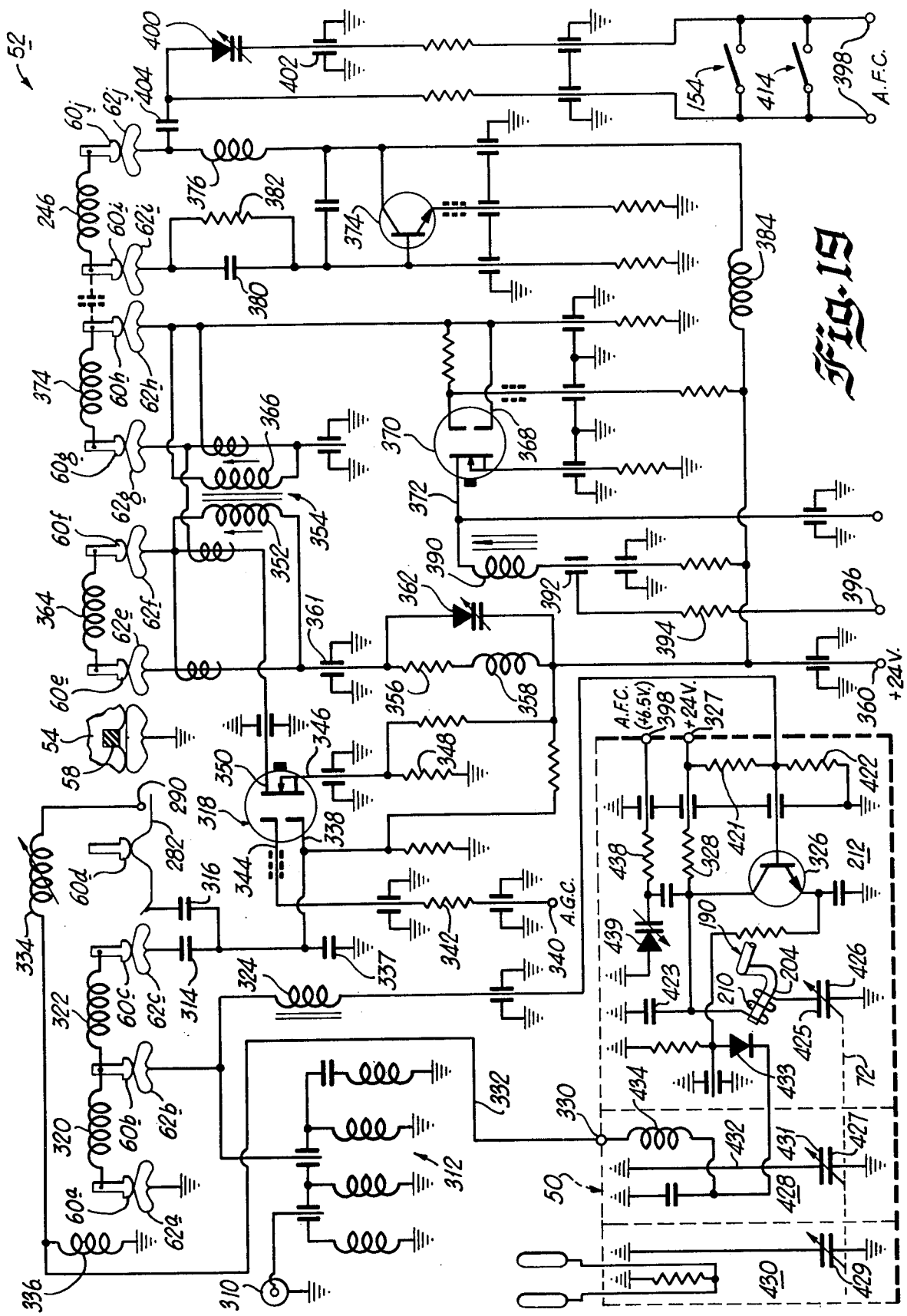

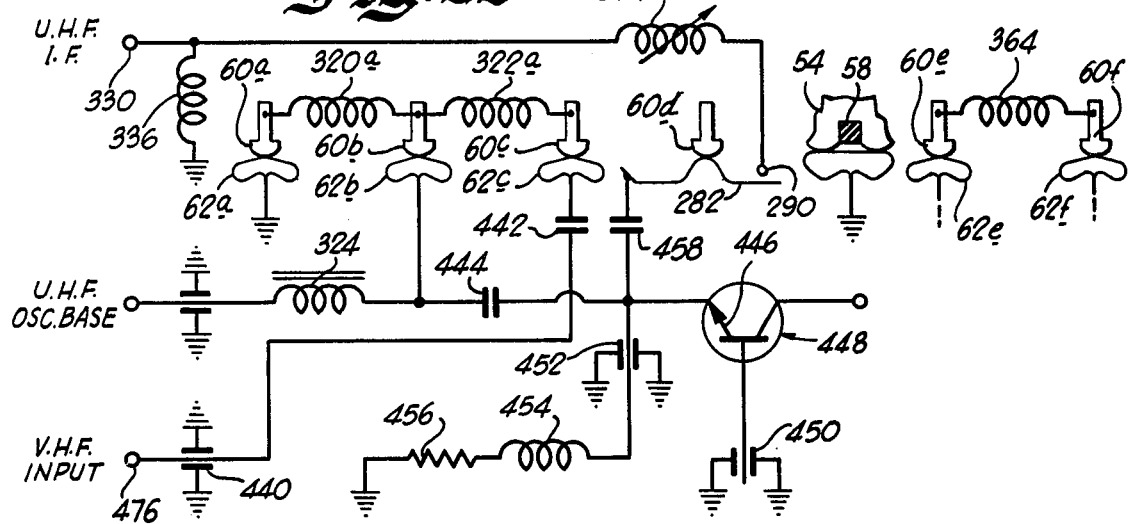
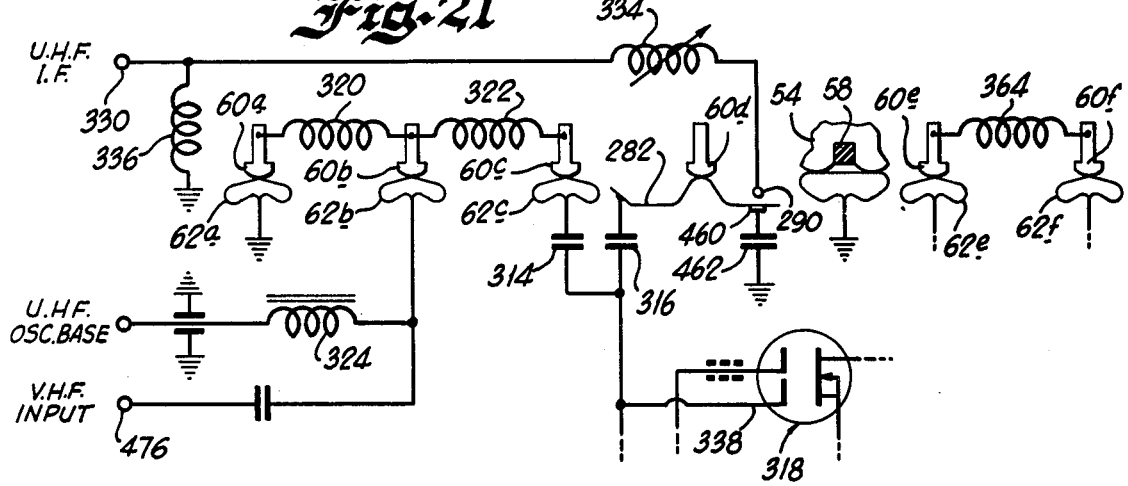
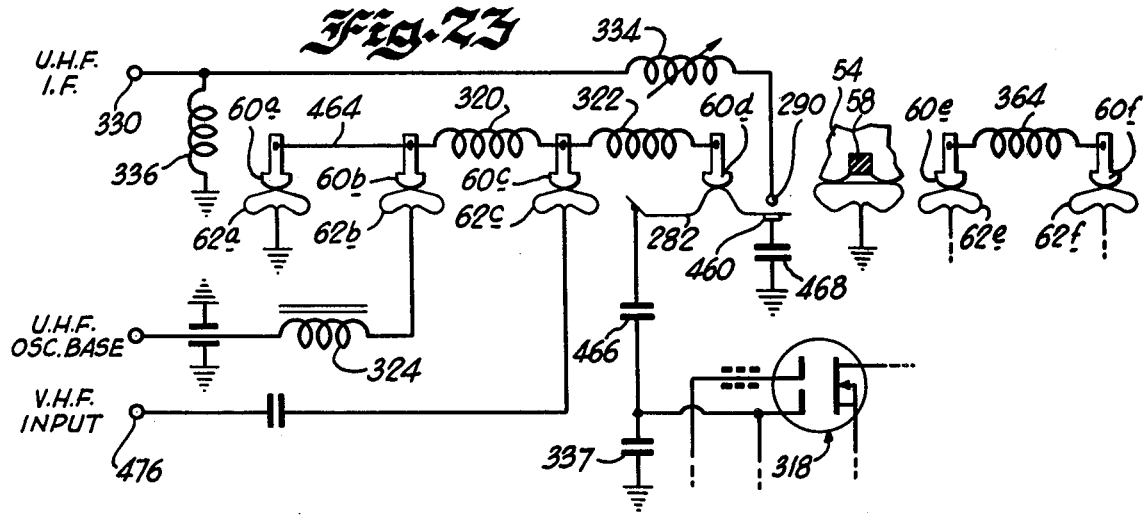

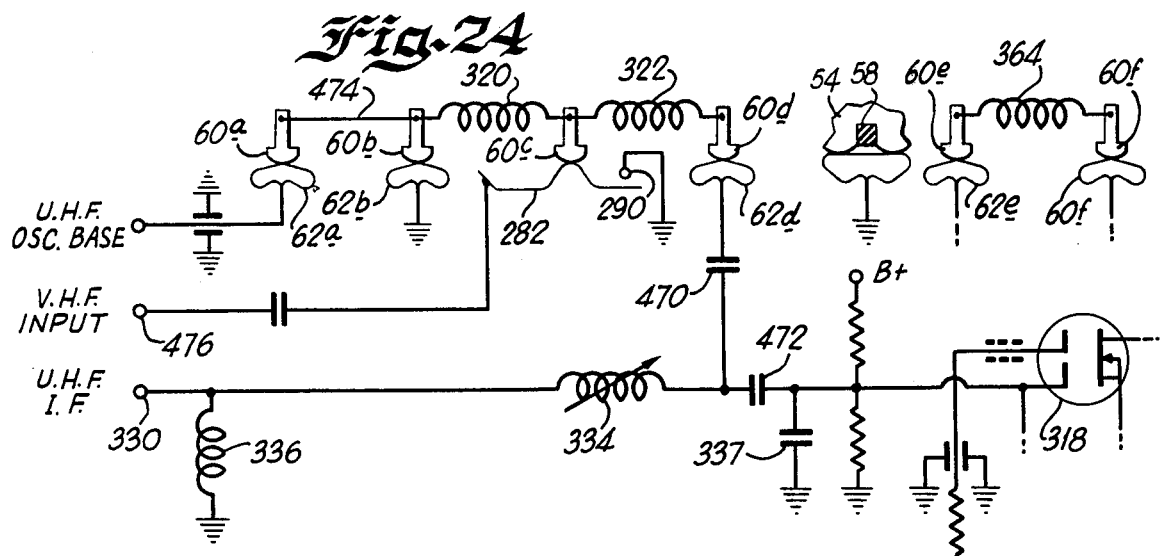
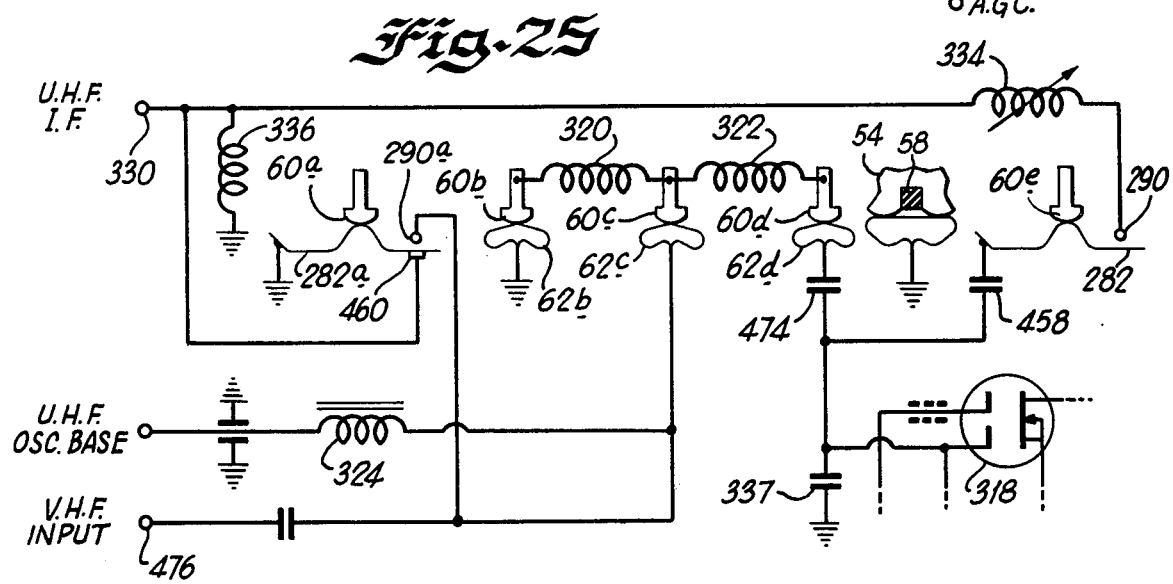
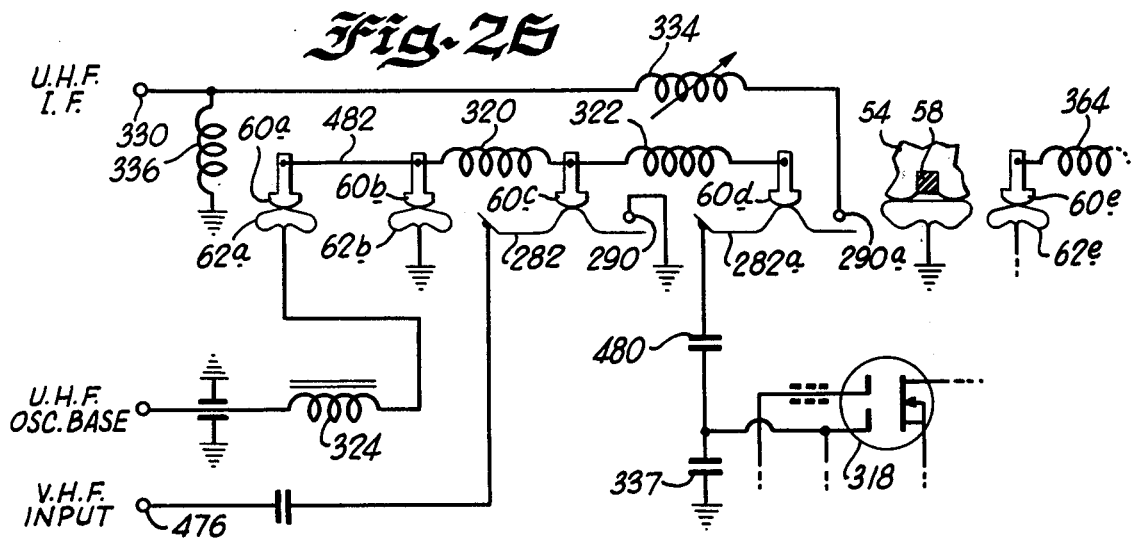

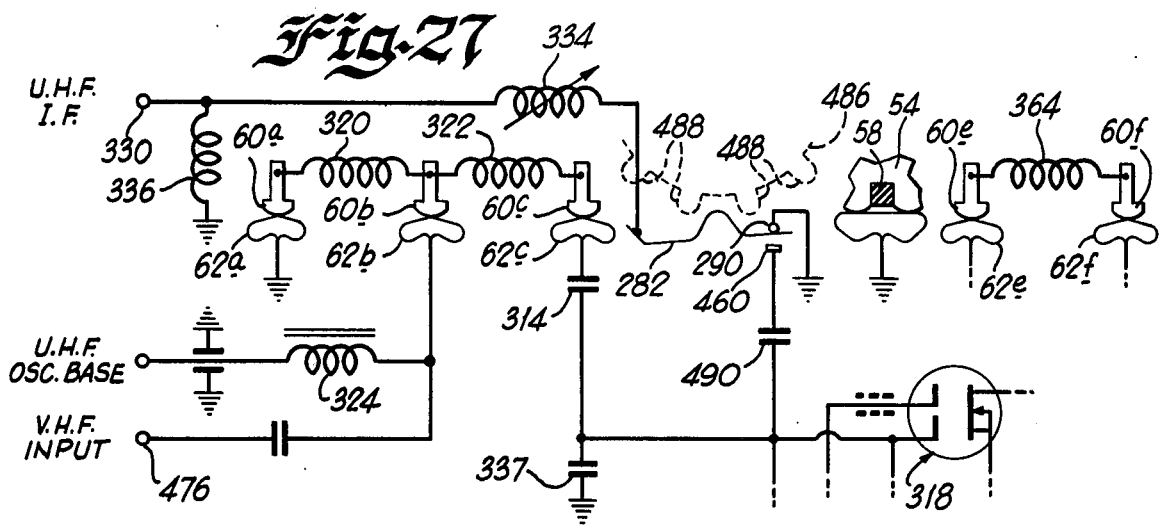
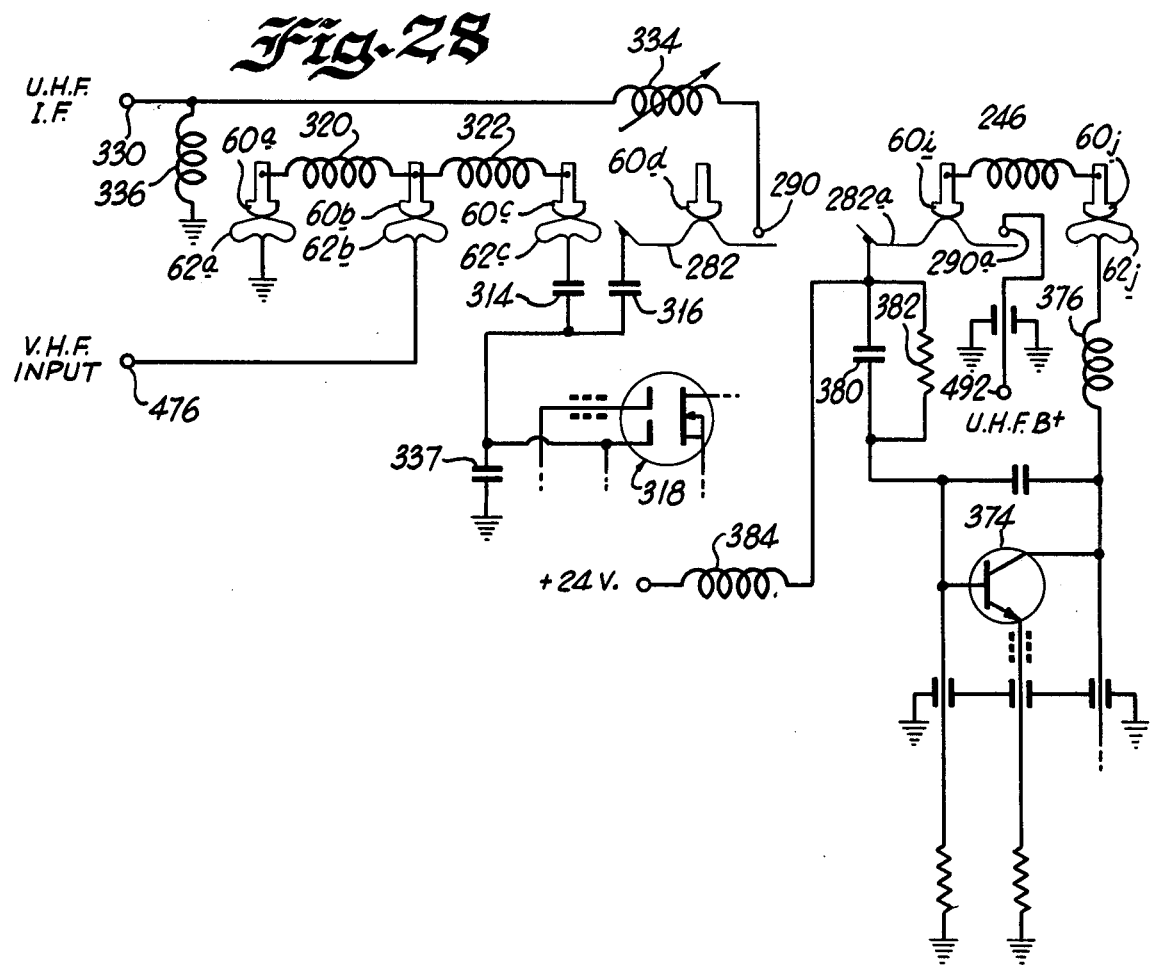

COMBINATION VHF AND UHF TUNER ARRANGEMENT

The present invention relates to combination VHF and UHF tuner arrangements, and more particularly, to a stator bar switching arrnagement which may be employed in the VHF tuner portion of the combination to provide simplified changeover from VHF to UHF channels.

It is a primary object of the present invention to provide a switching arrangement which is particularly suitable for use in the combination VHF-UHF tuner arrangements shown and described in Valdettaro U.S. application Ser. No. 776,890 filed March 11, 1977 and assigned to the same assignee as the present invention.

Briefly, in accordance with the invention, a stator bar switching arrangement is provided which is particularly suitable for use in combination VHF-UHF tuners. A movable switching member positioned on the main stator bar of a turret type VHF tuner is moved between fixed contacts on the stator bar by engagement with a projection on each of the tuning sticks of the turret in each VHF channel receiving position of the main selector shaft. Various switching arrangements are provided for VHF-UHF operation.

The invention, both as to its organization and method of operation, together with further objects and advantages thereof, will best be understood by reference to the following specification taken in connection with the accompanying drawings in which:

FIG. 3 is a sectional view taken along the line 3—3 of FIG. 2 and illustrating the display of a VHF channel number in a common viewing area;

FIG. 4 is a view similar to FIG. 3 but illustrating the display of a UHF channel number in the common viewing position;

FIG. 5 is a front view of the combination tuner of FIG. 1 with a portion of the front wall thereof broken away;

FIG. 6 is a rear elevational view of the combination tuner of FIG. 1;

FIG. 7 is a sectional view taken along the line 7—7 of FIG. 5;

FIG. 8 is a fragmentary sectional view taken along the line 8—8 of FIG. 7;

FIG. 9 is a sectional view taken along the line 9—9 of FIG. 1;

FIG. 13 is a sectional view taken along the lines 13—13 of FIG. 1;

FIG. 14 is a fragmentary sectional view taken along the line 14-14 of FIG. 13;

FIG. 15 is a fragmentary sectional view taken along the line 15—15 of FIG. 14;

FIG. 16 is a sectional view taken along the line 16—16 of FIG. 14;

FIG. 17 is a sectional view similar to FIG. 16 but showing the common selector shaft in a UHF position;

FIG. 18 is a front elevational view of the indicator strip employed in the tuner of FIG. 1;

FIG. 19 is a schematic diagram showing the electronic circuitry of the VHF and UHF tuner portions of the tuner of FIG. 1;

FIG. 20 is a schematic diagram of an alternative VHF-UHF switching arrangement for the tuner of FIG. 1;

FIG. 21 is a schematic diagram of a further alternative VHF-UHF switching arrangement for the tuner of FIG. 1;

FIG. 22 is a sectional view similar to FIG. 16 of an alternative switching arrangement used in the circuit of FIG. 21; and FIGS. 23 to 28, inclusive, are schematic diagrams of other alternative VHF-UHF switching arrangements for the tuner of FIG. 1.

FIG. 29 is a fragmentary sectional view similar to FIG. 10 but showing an alternative VHF-UHF switching arrangement for the tuner of FIG. 1;

FIG. 30 is a sectional view taken along the line 30—30 of FIG. 29; and

FIGS. 31 and 32 are sectional views taken along the line 31—31 of FIG. 29 and showing the common selector shaft in a VHF reception position and a UHF reception position, respectively.

Figure 1:
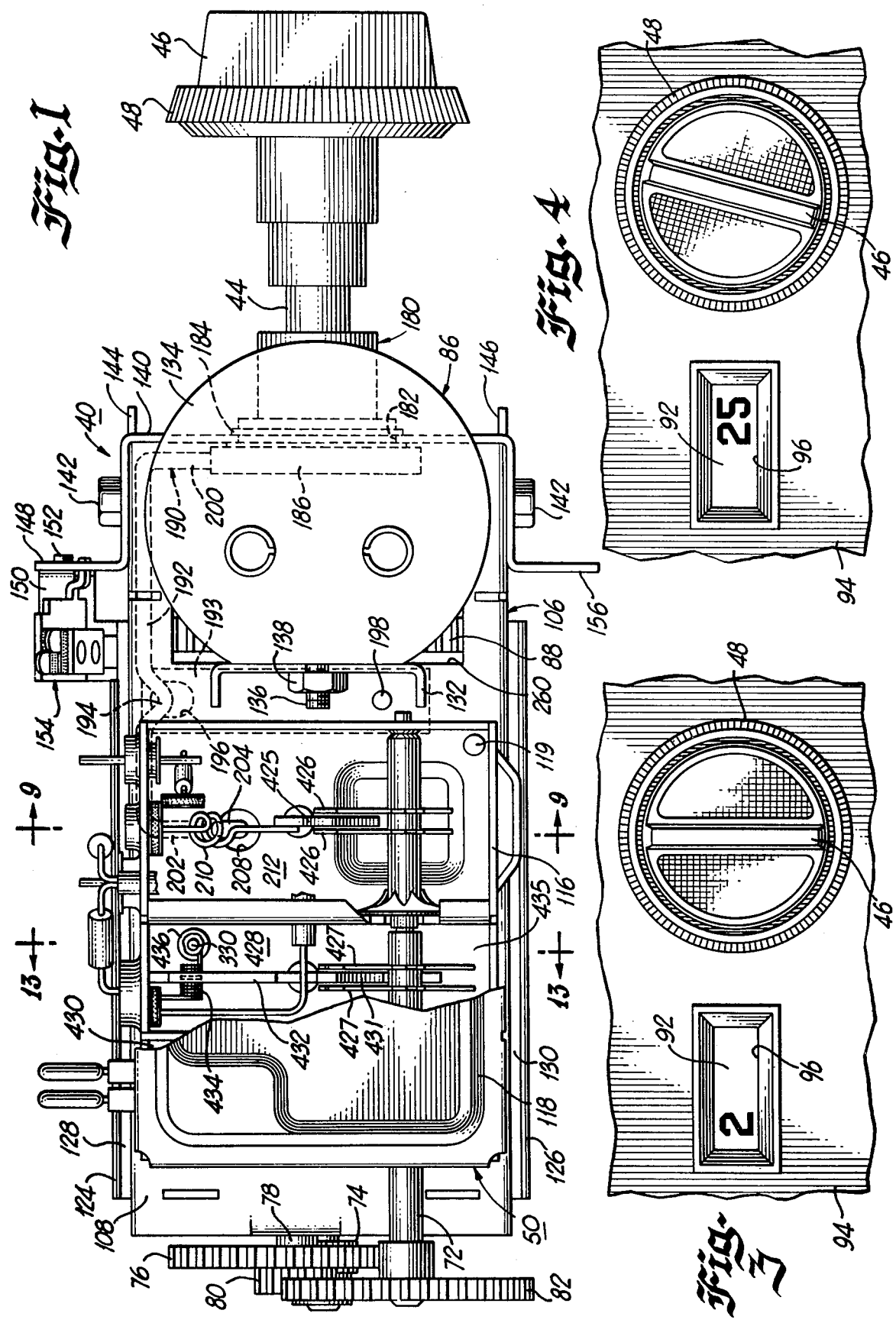
FIG. 1 is a side elevational view of a combination VHF-UHF tuning system in which the features of the present invention may be employed, with a portion of the cover of the UHF tuner portion thereof broken away.

Referring now to the drawings, and more particularly to FIGS. 1 to 19 thereof, inclusive, the present invention is therein illustrated in connection with a unified, combination VHF-UHF tuning system indicated generally at 40, this tuning system having a common main selector shaft 42 and a concentric outer fine tuning sleeve 44 which may be employed for both VHF and UHF fine tuning operations. A combined VHF-UHF station selector knob 46 is secured to the flattened end portion of the selector shaft 42 and a concentric outer fine tuning knob 48 is secured to the flattened end portion of the fine tuning sleeve 44.

The tuning system 40 includes a UHF tuner portion indicated generally at 50 and a VHF tuner portion indicated generally at 52. The VHF tuner 52 is of the turret type and includes a pair of transverse supporting discs 54 and 56 which are secured to the selector shaft 42 and support a plurality of individual tuning panels or sticks 58 about the periphery thereof. As the selector shaft 42 is rotated the contact members 60 of a particular one of the tuning sticks 58 are moved into engagement with corresponding stator contacts 62 provided on a stationary stator bar indicated generally at 64 so as to connect tuning coils, which are wound about the periphery of the tuning stick 58 and connected to the contact members 60, into operative engagement with the various tuning circuits such as the RF amplifier, mixer and oscillator circuits of the VHF tuner, as will be readily understood by those skilled in the art.

In general, the VHF tuner portion 52 is similar to the turret type tuner shown in Krepps, Jr. et al U.S. Pat. No. 3,227,981 which is assigned to the same assignee as the present invention, and reference may be had to said Krepps, Jr. et al patent for a detailed description of a turret tuner of this general type. However, the VHF tuner portion 52 includes certain features necessary to the VHF-UHF tuning system of the present invention, as will be described in more detail hereinafter.

The selector shaft 42, which acts as the conventional VHF tuning selector shaft, is also employed as the input shaft for 70-position detent operation of the associated UHF tuner 50. To this end the selector shaft 42 is provided with twenty-four equally-spaced detent positions by means of the detent wheel 66 which is secured to the shaft 42 behind the rear wall 68 of the VHF tuner chassis 70. The shaft 42 is interconnected with the main tuning shaft 72 of the UHF tuner portion by means of a high step-down ratio gear train. More particularly, a small spur gear 74 is secured to the end of the shaft 42 and engages a gear 76 which is rotatably mounted on a fixed post 78. A small-diameter gear 80, formed integrally with the gear 76, engages a large-diameter gear 82 which is secured to the main tuning shaft 72 of the UHF tuner 50.

Since only twelve tuning sticks 58 are provided on the VHF turret corresponding to the twelve VHF stations, in alternate ones of the 24 detent positions established by the detent wheel 66 the VHF tuning sticks 58 are selectively connected to the stator contacts of the stator 64, so as to permit reception of VHF stations in these alternate detent positions, and all of the tuning sticks 58 are disconnected from the stator contacts in the twelve intermediate positions between said alternate positions. In these twelve intermediate positions the UHF tuner 50 is energized to receive a UHF station, by means to be described in more detail hereinafter, and the I.F. output signal developed by the UHF tuner 50 is amplified in the VHF tuner portion 52 which is operated as an I.F. amplifier for UHF reception. However, if only a single revolution of the common selector shaft were employed for VHF-UHF reception, only twelve UHF stations could be selected. The UHF band is covered by rotating the selector shaft 42 a plurality of revolutions and during each of these revolutions the VHF stations are repeatedly received in sequence as the shaft 42 is rotated. Also, a strip type dial indicator indicated generally at 86 is directly connected to the common selector shaft 42, by means of a gear 88 which is carried by and secured to the selector shaft 42 and engages a crown gear 90 on the strip type dial indicator 86, so that the indicator strip 92 of the indicator 86 is advanced one increment for each detent position of the selector shaft 42. In the embodiment illustrated in FIGS. 1 to 19, inclusive, the UHF channel numbers are provided in one area extending along the length of the strip 92 (FIG. 18) and the VHF channel numbers are repeated in sequence in an area extending along the length of the strip 92 and spaced laterally from the UHF channel numbers. As best illustrated in FIG. 18, the VHF and UHF channel numbers are staggered along the length of the tape so that only one channel number, either a VHF channel number or a UHF channel number, can be viewed at a time. More particularly, the front panel 94 of the television cabinet is provided with a viewing window 96 within which the VHF and UHF channel numbers on the strip 92 are alternately displayed. When the common selector shaft 42 is in one of the 12 alternate detent positions assigned to VHF stations the corresponding VHF channel number appears in the left-hand portion of the viewing area 96, as shown in FIG. 3. When the selector shaft 42 is in the positions between the alternate VHF positions the UHF channel number assigned to the UHF station being received by the tuner 50 is displayed in the right-hand portion of the viewing window 96, as shown in FIG. 4.

Considering now in more detail the mechanical aspects of the VHF-UHF tuning system, the VHF tuner chassis 70 comprises a top deck portion 100, having the depending side flanges 102 associated therewith, a front wall 104 and the rear wall 68 described heretofore. A U-shaped main frame indicated generally at 106, which includes a side wall portion 108, top wall 110 and bottom wall 112 cooperates with the U-shaped VHF tuner chassis 70 provide a housing for the VHF turret which is mounted on the selector shaft 42 and includes the tuning sticks 58.

More particularly the flange portions 102 of the chassis 70 are secured to the top and bottom walls 110 and 112 of the U-shaped main frame 106 by means of the bolts 114 to provide a rugged box-like construction which houses the VHF turret.

The UHF tuning portion 50 includes a cup-shaped main housing 116 and a cooperating sheet metal cover 118 which is secured over the opening of the housing 116 to provide a shielded enclosure for the UHF tuning components. The housing 116 is secured to the wall 108 of the U-shaped main frame 106 by means of the bolts 119 so that the main rotor shaft 72 of the UHF tuner is accurately registered with respect to the common selector shaft 42 through the main frame 110 to which the VHF tuner chassis 70 is connected.

In order to permit servicing and repair of parts within the VHF tuner portion 52, the top and bottom walls 110 and 112 are provided with openings 120 and 122 respectively which are normally closed by means of sliding covers 124 and 126 which ride on flanges 128 and 130 formed out of the top and bottom walls 110 and 112 respectively. The covers 124 and 126 may be removed by sliding them off of the flanges 128, 130, i.e. by movement to the rear of the tuner, to permit access to the interior of the VHF tuner portion 52.

In order to mount the strip dial indicator 86 in proper relation to the driving gear 88 on the selector shaft 42, a bracket 132 is secured to the wall 108 of the U-shaped main frame 106 by any suitable means such as welding, brazing or the like, and the circular housing 134 (FIG. 1) of the strip type dial indicator 86 is secured to the bracket 132 by means of the screw 136 and nut 138. In this connection it is pointed out that the strip type dial indicator 86 may be of the type shown and described in Valdettaro U.S. Pat. No. 3,916,820 and hence a detailed description thereof in connection with the present invention is considered unnecessary herein, it being pointed out that the strip type dial indicator 86 is of substantially greater width when employing combined VHF and UHF channel numbers in the manner described in detail heretofore in connection with FIGS. 2, 3, 4 and 18.

As best illustrated in FIG. 1, a generally U-shaped front bracket 140 is secured to the top and bottom walls 110, 112 of the U-shaped main frame 106 by means of the screws 142, the walls 110, 112 being provided with forwardly extending lug portions 144 and 146, respectively, which extend through openings in the U-shaped bracket 140 and locate the same relative to the main frame 106. An outwardly extending flange portion 148 of the bracket 140 is also employed to mount a bracket 150, which is secured to the flange 148 by means of the screw 152, the bracket 150 supporting an AFC interchannel defeat switch assembly indicated generally at 154 which will be described in more detail hereinafter.

The flange 148 and an outwardly extending flange 156 on the other side of the bracket 140 may be used to mount the tuning assembly 40 on the main television receiver chassis so that the numbers on the strip dial indicator 86 are suitably registered with the viewing window 96 in the front panel 94 of the television cabinet. In the alternative, any other suitable means may be employed to mount the tuning system 40 on the main television receiver chassis, as will be readily understood by those skilled in the art.

Figure 10:
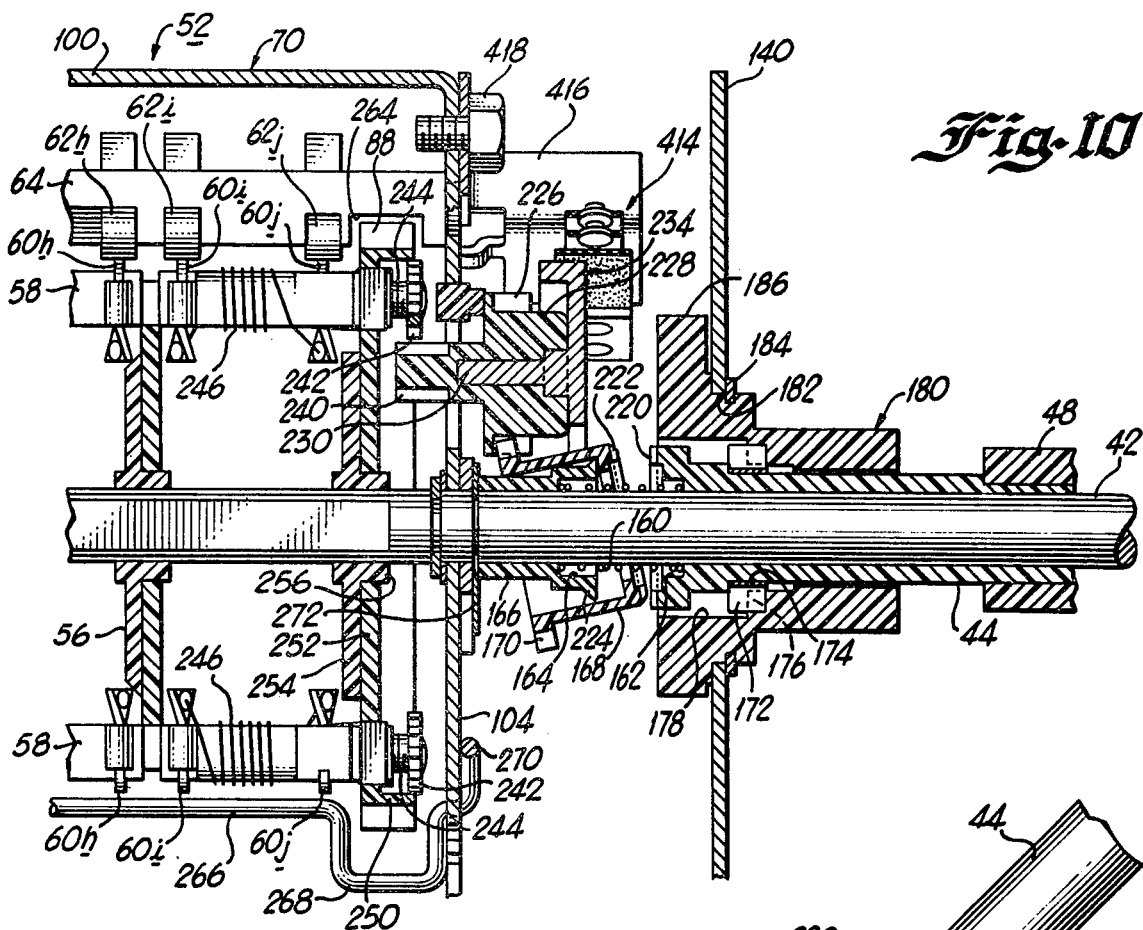
FIG. 10 is a sectional view taken along the line 10—10 of FIG. 2.
Figure 12:
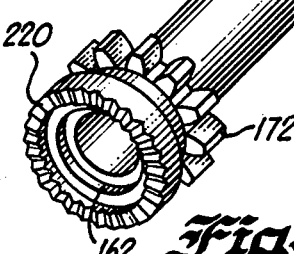
FIG. 12 is a perspective view of the common fine tuning shaft of the tuner of FIG. 1.
Figure 11:
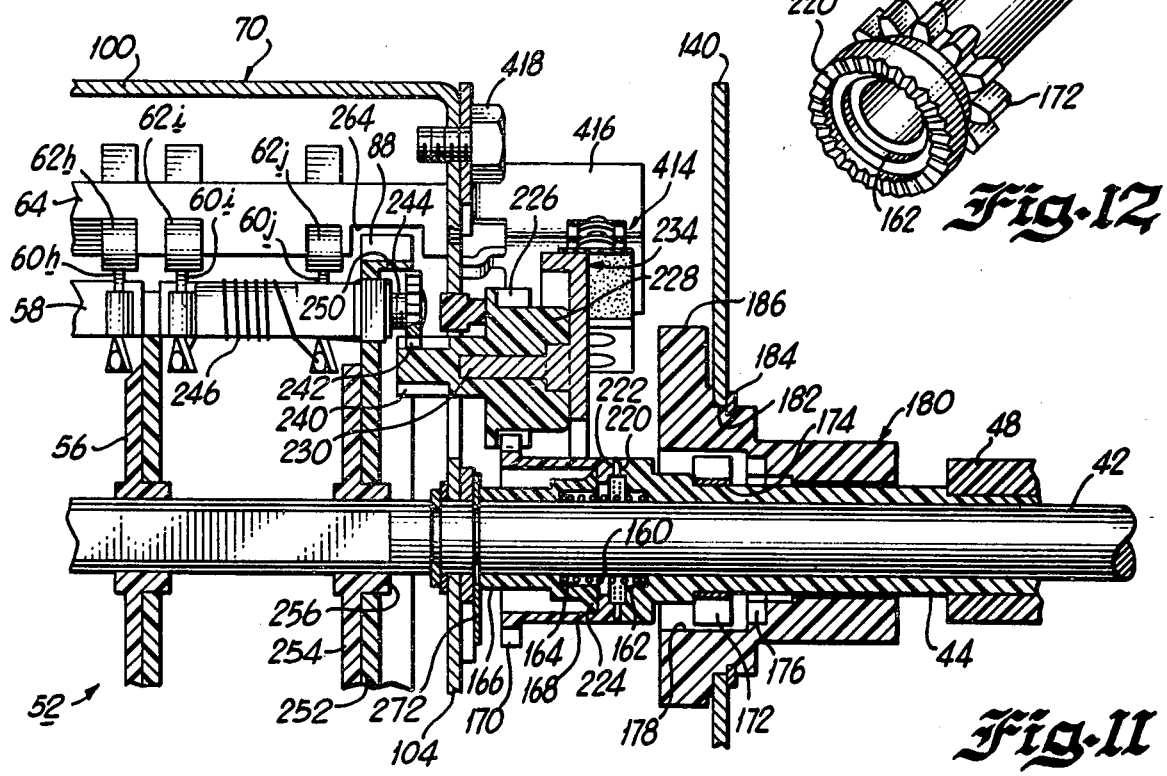
FIG. 11 is a view similar to FIG. 10 but showing the VHF fine tuning mechanism in a VHF fine tuning adjustment position.

In order to provide an arrangement whereby the fine tuning sleeve 44 may be used for both VHF and UHF fine tuning operations, the sleeve 44 is slidably mounted on the selector shaft 42 and is biased to a forward position by means of a coil spring 160 one end of which is positioned in a recess 162 formed in the rear end of the sleeve 44. The other end of the coil spring 160 is seated in a forwardly opening recess 164 provided in a sleeve 166 which is also mounted on the shaft 42 and acts as a fulcrum for a pivotally mounted cup-shaped fined tuning member 168 provided with gear teeth 170 about the periphery of the open rearward end of the cup 168. When the sleeve 44 is biased to the forward position by the coil spring 160, as shown in FIG. 10, gear teeth 172 on the sleeve 44 engage a series of gear teeth 176 which are formed in the bottom of a rearwardly opening recess 178 in a UHF fine tuning cam member 180 which is journaled within an opening 182 in the front bracket 140 by means of a C washer 184. The gear teeth 172 may be formed integrally with the sleeve 44 or as in the illustrated embodiment may comprise a metal sleeve 174 which is secured to the sleeve 44. When the fine tuning knob 48 is in its outermost position with the gear teeth 172 in engagement with the gear teeth 176, rotation of this knob causes rotation of the UHF cam member 180.

The UHF fine tuning cam member 180 is provided with a peripheral cam surface 186 which is eccentric with respect to the axis of the common selector shaft 42. A UHF fine tuning member in the form of a brass rod indicated generally at 190 in FIG. 5, is provided with an intermediate portion 192 (FIG. 2) which is held against the corner formed by the walls 108 and 110 of the main U-shaped frame 106 by means of a flat spring 193. More particularly and as best illustrated in FIGS. 7 and 8, the intermediate portion 192 of the tuning rod 190 is provided with a V-shaped projecting portion 194 and the flat spring 193 is provided with an elongated opening 196 therein the edges of which bear upon the outer sloping edges fo the V-shaped portion 194. The spring 193 is secured to the wall 108 of the frame 106 by means of the screws 198.

Figure 2:
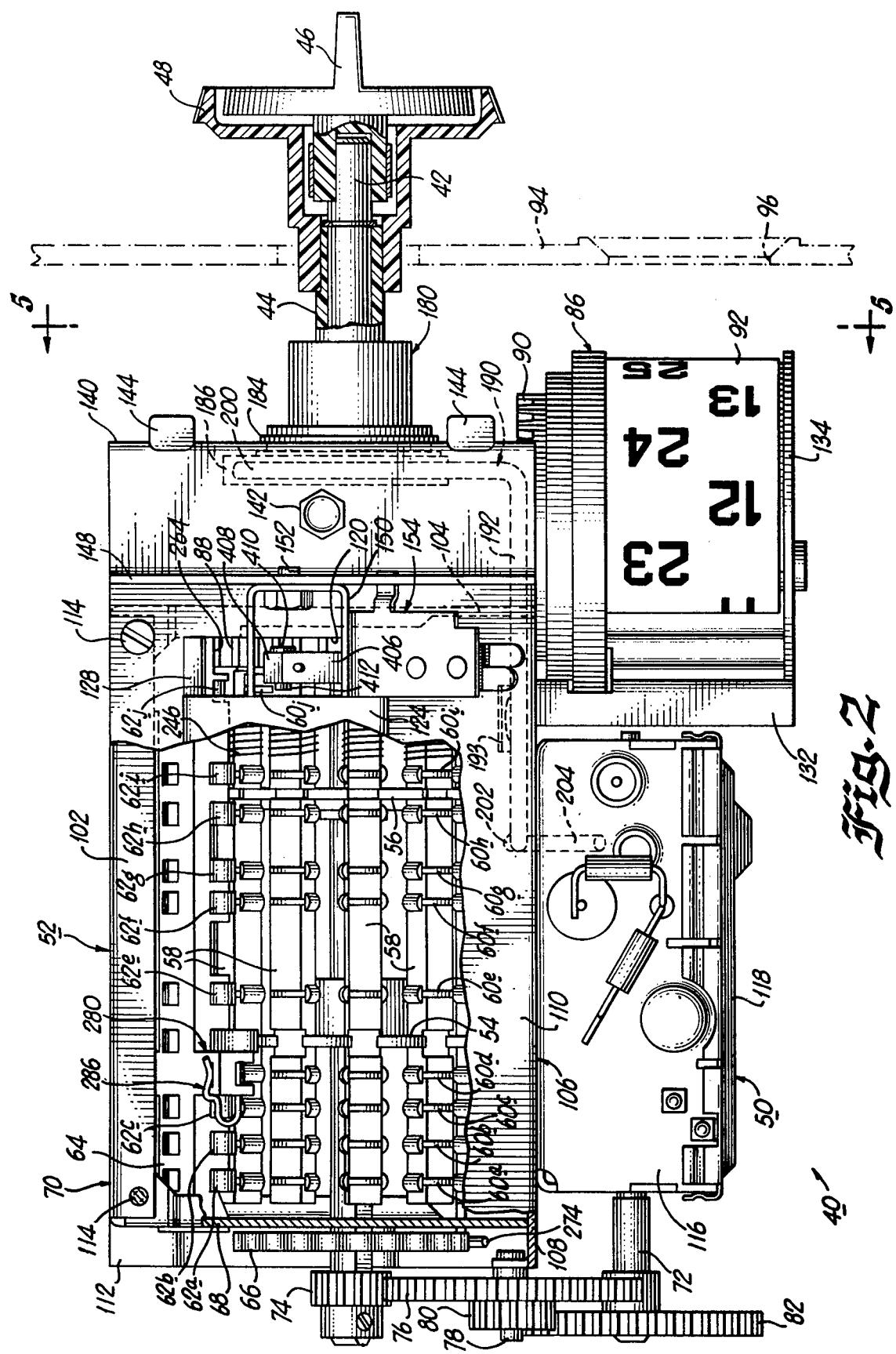
FIG. 2 is a plan view of the combination tuner of FIG. 1 with a portion of one wall of the VHF tuner thereof broken away.

The forward end of the UHF fine tuning rod 190 terminates in a right-angle end portion 200 which rides upon the peripheral cam surface 186 of the UHF fine tuning cam member 180, as best illustrated in FIGS. 1 and 2. The rod 190 is also provided with a right-angle portion 202 at the other end of the intermediate portion 192 which terminates in a hook-shaped end portion 204 which extends at right angles to the portion 202, as best illustrated in FIG. 9. The hook-shaped end portion 204 extends through an opening 206 in the wall 108 of the U-shaped main frame 106 and through an opening 208 in the UHF tuner housing 116 so that the free end portion of the hook 204 may be moved into and withdrawn from an oscillator coil 210 in the oscillator compartment 212 of the UHF tuner 50. Since the flat spring 193 engages the V-shaped portion 194 of the tuning rod 190 at a point offset from the axis of the longitudinally extending intermediate portion 192 of the rod 190, a biasing force is exerted on the right-angle end portion 200 so that this end portion is urged in the direction of the arrow 199 in FIG. 5 and is held against the peripheral cam surface 186 of the UHF fine tuning cam member 180. Accordingly, when the common fine tuning knob 48 is positioned in its outermost position and is rotated, the fine tuning cam 180 is rotated so that the tuning rod 190 is pivoted about the axis of the longitudinally extending intermediate portion 192 thereof with the result that the end portion 204 thereof is moved with respect to the oscillator tuning coil 210. Since the rod 190 is made of brass a UHF fine tuning function in connection with the UHF station being received is performed. The electrical details of the UHF oscillator circuit will be described hereinafter.

It will be noted that the tuning rod 190 is made of heavy stock as shown in the drawings, and is accurately located both longitudinally and radially by engagement of the edges of the opening 196 in the spring 193 with the portion 194 of the rod 190. Accordingly, the position of the rod 190 is determined by rotation of the cam member 180, is maintained between fine tuning operations and is unaffected by rotation of the common selector shaft 42 during VHF and UHF channel selection. Also, since the tuning rod 190 is used as a vernier adjustment the end 204 thereof may be arranged to effect a change of approximately 6 MHz for a travel of about 0.150 inches. With such an arrangement vibration and microphonics, which cause much smaller vibrations in the position of the end 204, do not deteriorate the operation of the UHF tuner 50.

Considering now the manner in which a VHF fine tuning function is performed by the common fine tuning knob 48, when this knob is moved rearwardly against the force of the coil spring 160 a VHF memory fine tuning operation is effected on the active one of the tuning sticks 58. In general, this VHF memory fine tuning operation is accomplished by an arrangement similar to that shown in Badger et al U.S. Pat. No. 3,316,770 and reference may be had to said Badger et al patent for a detailed description of such memory fine tuning mechanism. However, for the purposes of the present invention, it may be stated that when the tuning knob 48 is moved rearwardly against the force of the coil spring 160 an annular series of rearwardly projecting teeth 220 on the sleeve 44 are moved into engagement with a corresponding series of teeth 222 on the forward end of the cup-shaped member 168 as this member is tilted about the fulcrum 224 formed in the sleeve 166. As a result, the member 168 is moved to the position shown in FIG. 11 as the sleeve 44 is moved rearwardly and the teeth 220 engage with the teeth 222. As the member 168 is moved to the horizontal position shown in FIG. 11 the gear teeth 170 thereof are moved into engagement with gear teeth 226 which are formed in a pinion member 228 which is rotatably mounted on a post portion 230 formed in a pivotally mounted member 234 which is pivotally mounted on the post 236 (FIG. 5) mounted on the front wall 104 of the VHF tuner chassis 70. As the member 168 was pivoted to the position shown in FIG. 11 it moves the member 228 outwardly against the force of the coil spring 238 (FIG. 5) so that the gear teeth 240 formed in the pinion 228 but offset from the teeth 226 are moved into engagement with corresponding gear teeth 242 formed in the head of each tuning screw 244 which projects from the forward end of each tuning stick 58. Accordingly, when the fine tuning shaft is rotated while in its rearward position, the members 168 and 228 are also rotated so that the tuning screw 244 is moved with respect to the oscillator tuning coil 246 wound about the periphery of the tuning stick 58.

It will be noted that when the tuning sleeve 44 is moved to its rearward position during a VHF fine tuning operation the teeth 172 are moved out of engagement with the teeth 176 in the UHF cam member 180 so that the UHF fine tuning adjustment is not disturbed during the VHF fine tuning operation. However, as soon as pressure is removed from the fine tuning knob 48, coil spring 160 causes the sleeve 44 to move to its outward position shown in FIG. 10 in which position the teeth 220 are disengaged from the teeth 222 and the sleeve 44 is connected to the UHF fine tuning cam member 180.

The gear 88 which drives the dial indicator 86, is formed in the outer flange portion 250 of a disc 252 which is mounted on and is rotatable with the selector shaft 42. In the illustrated embodiment the disc 252 is secured to a second disc member 254 having a hub portion 256 which is formed with a double D opening to cooperate with the double D cross section of the selector shaft 24. If desired, the flange portion 250 of the disc 252 may be dimensioned to engage the gear teeth 242 of each tuning screw 244 so as to hold the tuning screws in their adjusted positions after a memory fine tuning operation has been made. In the alternative a conventional spring clip may be provided on each stick to hold the tuning screw 244 in adjusted position.

In order to permit engagement of the gear 88 with the crown gear 90 on the strip type dial indicator 86, the sidewall 108 of the main U-shaped frame 106 is provided with an opening 260 (FIG. 1) which provides clearance for the teeth of the crown gear 90. Also, the front wall 104 of the VHF tuner chassis 52 is provided with the opening 262 (FIG. 5) to provide clearance for the crown gear 90. It will be noted that by providing the above described clearance opening 260, 262 and employing a gear 88 of relatively large diameter which will mesh with the crown gear 90 of the dial indicator 86 which is external to the VHF chassis 70, an arrangement is provided whereby the dial indicator may be driven directly from the selector shaft 42 at a point behind the fine tuning mechanisms for effecting both UHF and VHF fine tuning, thereby substantially simplifying the dial indication of both VHF and UHF channels over prior arrangements wherein dial information is obtained through shafts which are concentric with the selector and fine tuning shafts.

In order to permit the use of a relatively largediameter gear 88 within the VHF tuner chassis 70, the stator bar 64 is provided with a clearance opening 264 (FIG. 10) which permits the bar 64 to be mounted in the end wall 104 of the VHF tuner chassis 70 while permitting rotation of the gear 88 without interfering with the stator bar 64. Also, the torsion wire detent spring 266 which extends from the front wall 104 of the VHF tuner chassis to the rear wall 68 thereof is provided with an offset portion 268 (FIG. 10) to provide clearance for the gear 88. The torsion wire spring 266 is of the same general type shown and described in Valdettaro et al. U.S. Pat. No. 3,234,801 assigned to the same assignee as the present invention, and reference may be had to said Valdettaro et al U.S. patent for a detailed description of such a torsion detent spring. The spring 266 is provided with a front right-angle end portion (FIG. 5) which exerts a side thrust on the shaft 42 through the intermediate member 272 (FIG. 5) and holds the shaft against suitable bearing surfaces in the front wall 104. Also, the spring 266 is provided with a rear right-angle end portion 274 (FIG. 6) which is provided with a V-shaped end adapted to seat in one of the detent valleys 276 of the detent wheel 66, as best illustrated in FIG. 6. The right-angle arm portion 274 thus provides detent action for the twenty-four detent positions of the shaft 42 and also urges the rear end of the shaft 42 against suitable bearing surfaces provided in the rear wall 68 of the VHF tuner chassis 70.

While the positioning of the gear 88 within the VHF tuner chassis 70 has certain advantages, as discussed heretofore, the inclusion of this relatively large-diameter gear within the VHF tuner chassis limits the number of contacts which can be positioned on the stator bar 64 since the clearance opening 264 is needed to permit rotation of the gear 88. In accordance with the present invention, the switching between VHF and UHF channels in alternate positions of the twenty-four position detent wheel 66 is automatically provided by means carried by each of the tuning sticks 58 so that not additional stator bars or auxiliary switches are required, in contradistinction to combination VHF-UHF tuner arrangements such as shown in Weigel U.S. Pat. No. 3,757,227 assigned to the same assignee as the present invention. More particularly the stator bar 64 is provided with a cross bar portion 280 (FIG. 15) to which a flexible spring contact member 282 is secured by means of the rivet 284 (FIG. 16). A generally U-shaped wire clip 286 is positioned transversely of the other end of the cross bar 280, the bar 280 being provided with a relatively deep recess 288 (FIG. 14) which receives one arm portion 290 of the U-shaped clip 286 and a top opening recess 292 which receives the curved upper end portion 294 of the clip 286. In the alternate VHF positions of the selector shaft 42 a contact 60d on one of the tuning sticks 58 engages an upwardly bowed intermediate portion 296 of the spring contact 282, as shown in FIG. 16, and moves the flat end portion 298 of the spring 282 away from the arm 290 of the clip 286. However, when the selector shaft 42 is detented in one of the UHF positions between the alternately spaced VHF positions, the tuning sticks 58 occupy the position shown in FIG. 17 wherein none of these sticks contact the spring member 282 and hence the flat end portion 298 thereof is permitted to engage the arm 290 of the spring clip 286. Accordingly, in the UHF positions of the shaft 42 the spring contact 282 is connected to the U-shaped clip 286 and in the VHF positions of the shaft 42 these members are disconnected. Connection may conveniently be made to the spring contact member 282 by means of a tab 300 provided thereon and connection to the clip 286 may conveniently be made by soldering a wire to the bight portion 302 of the clip 286. In this connection it will be understood that the clip 286 is made of sufficiently large diameter wire that the arm 290 thereof does not flex but instead acts as a fixed contact against which the blade portion 298 of the spring contact 282 may be held in the UHF positions by the resiliency of the spring member 282.

Considering now the manner in which closure of the contacts 282 and 286 is employed to effect automatic changeover from VHF to UHF operation, reference may be had to the schematic diagram shown in FIG. 19. In this figure the VHF antenna input is supplied through the 72-ohm connection 310, and through a suitable filter network indicated generally at 312 to the stator contact 62b, the stator contact 62a being connected to ground and the stator contact 62c being connected through a capacitor 314 to the input gate No. 1 of a MOSFET 318 of the insulated gate type. When one of the tuning sticks 58 is contacting the stator contacts 62a, 62b and 62c as shown in FIG. 15, the coils 320 and 322 which are wound about the stick, form a tapped input coil for VHF reception. Also, when a stick is connected to the stator contacts 62a, 62b, 62c, etc. a d.c. ground connection is supplied through the contact 62a, the coil 320, the stator contact 62b and a choke coil 324 to the base of the UHF transistor oscillator 326 located in the UHF tuner portion 50 so that this base is grounded through the above-described circuit. In the circuit of FIG. 19, an energizing B plus voltage is supplied to the UHF oscillator 326 at all times from the terminal 327 and through the collector resistor 328. However, in alternate VHF positions of the shaft 42 the base of the oscillator 326 is grounded through the above-described circuit to the ground stator contact 62a so that the UHF oscillator 326 is prevented from oscillating when the shaft 42 is in its alternate VHF positions. Accordingly, in VHF positions, when a tuning stick is in contact with the stator contacts 62a, 62b and 62c, the VHF signal is appropriately matched by the input tuning coil 320, 322 and is supplied through the capacitor 314 to the input of the MOSFET 318.

When the shaft 42 is in a UHF position none of the tuning sticks contact the stator contacts 62a, 62b and 62c. Accordingly, the base of the UHF oscillator 326 is no longer grounded by the stator contact 62a and hence the UHF oscillator is permitted to oscillate for reception of UHF signals. More particularly, when ground is removed from the base of the oscillator 326 during UHF reception, the proper bias for this base is established by the resistors 421, 422. The oscillator tank circuit includes the capacitor 423 connected between the collector of the transistor 326 and ground, the oscillator coil 210 which carries a fixed capacitor plate 425 on one end thereof and the variable capacitor plates 426 which are carried by the main UHF tuning shaft 72. The shaft 72 also carries the capacitor plates 427 which are positioned in the mixer compartment 428 of the UHF tuner 50, and the plates 429 in the RF input compartment 430. The plates 427 cooperate with the fixed plate 431 to vary the tuning of the mixer section of the UHF tuner 50, a fixed inductance 432 forming the other primary tuning element of the mixer section 428. A crystal mixer 433 is employed to develop a 40 MHz IF signal by mixing the RF input from the section 430 with an oscillator signal from the oscillator 326, as will be readily understood by those skilled in the art.

The forty-Mhz IF output signal which is connected to the output terminal 330 of the UHF tuner 50 is supplied by way of the unshielded conductor 332 and a matching coil 334 to the arm 290 of the clip 286. Since the spring contact 282 is in engagement with the arm 290 in the UHF positions of the shaft 42 the UHF IF signal is supplied through the switch contact 282 and a capacitor 316 to the input of the MOSFET 318 in place of the VHF input signal. However, when the shaft 42 is turned to the next detent position, i.e. a VHF station, a contact 60d on that tuning stick will engage the intermediate portion 296 of the switch contact 282 and depress it to the position shown in FIG. 16 so that no contact is made between the arm 290 and the contact 282. The IF input connection from the UHF tuner 50 is thus disconnected in the VHF positions of the shaft 42.

In the alternative VHF positions of the common selector shaft 42, i.e. when one of the tuning sticks is connected to the stator contacts 62, the MOSFET 318 is operated as an RF amplifier for the VHF signal supplied to the input electrode 338, which is gate No. 1 of the MOSFET 318. An AGC signal is supplied from the main television receiver by way of the input terminal 340 and a resistor 342 to the gate No. 2 electrode 344 of the MOSFET 318. The source electrode 346 thereof is connected to ground through a bias resistor 348 and an amplified VHF signal is developed at the drain electrode 350 of the MOSFET 318 which is connected to the primary winding 352 of a 40-Mhz IF transformer indicated generally at 354. The other end of the winding 352 is connected through the dropping resistor 356 and a choke coil 358 to the 24 volt B plus input terminal 360, a variable capacity diode 362 being connected across the series combination of the resistor 356 and coil 358. In the VHF positions of the shaft 42 an RF output tuning coil 364, which is wound about the tuning stick 58 and connected to the contacts 60e and 60f thereof, is connected in shunt with the primary winding 352 through the stator contacts 62e and 62f so that the output circuit of the MOSFET 318 is tuned to the desired VHF signal frequency. When an AGC bias is applied to the terminal 340, the output capacity of the MOSFET 318 diminishes which would normally result in detuning of the circuit 352, 364. However, since the current drawn by the drain electrode 350 also diminishes under these conditions the bias across the variable capacity diode 362 also decreases thereby minimizing the detuning effect produced by the AGC voltage, it being noted that the diode 362 is effectively in parallel with a feedthrough capacitor 361.

The secondary winding 366 of the transformer 354 is supplied to the input electrode 368 (Gate No. 1) of an insulated gate MOSFET 370 which acts as a mixer and develops a suitable 40-Mhz IF signal at the drain electrode 372 thereof. When the shaft 42 is in the alternate VHF positions the other RF tuning coil 374, which is wound about the stick 58 is connected in shunt with the secondary winding 366 through the stator contacts 62g and 62h so that the input circuit of the MOSFET 370 is tuned to the desired VHF signal frequency. A transistor 374 is operated as the VHF oscillator, the tank circuit for this oscillator including the fixed coil 376 and the tuning coil 246 which is wound about the tuning stick 58 and connected to the contacts 60i and 60j. When the shaft 42 is in the alternate VHF positions the coil 246 is connected through the stator contact 62i and a biasing network including the capacitor 380 and shunt resistor 382 to the base of the transistor 374 to provide sustained oscillations in the oscillator tank circuit. B plus for the collector of the transistor 374 is supplied through the choke coil 384 from the B plus terminal 360.

As discussed generally heretofore, when the shaft 42 is in the UHF positions, none of the tuning sticks 58 are connected to the stator contacts 62 and a UHF IF signal is supplied through the interconnected members 282, 290 and the capacitor 316 to the input of the RF amplifier 318. Under these conditions the output circuit of the amplifier 318 and the input circuit of the mixer 370 are tuned to the 40-Mhz IF frequency by means of the transformer 354 and hence the UHF IF signal receives additional amplification in both of the MOSFETS 318 and 370. During UHF operation the oscillator 374 is not oscillating since the bias voltage normally supplied to the base of the transistor 374 is removed when no tuning coil 246 is connected to the stator contacts 62i, 62j. The output of the mixer-amplifier 370 is supplied to a tuning coil 390 which is tuned to 40-Mhz by the circuit capacitances associated therewith, a capacitor 392 being employed to couple the 40-Mhz output signal through the resistor 394 to the VHF IF output cable 396.

In order to provide automatic frequency control for the VHF oscillator 374, an AFC control voltage from the television receiver is supplied through the terminals 398 to a voltage variable diode 400. One side of the diode 400 is connected to ground through the feed-through capacitor 402 and the other side of the capacitor is coupled through the series capacitor 404 to the stator contacts 62j and the upper end of the coil 376. An AFC interchannel defeat switch assembly 154 is provided to disable the AFC control voltage during periods when a new channel is being selected so that the AFC control voltage will not interfere with the selection of a signal from a different VHF channel.

The UHF tuner 50 is also controlled by an AFC control voltage from the associated television receiver. However, since the UHF tuner 50 does not need as great a range as the VHF tuner 52, only one of the AFC terminals 398 is connected to the UHF tuner 50, as will be readily understood by those skilled in the art. This AFC voltage is supplied through the resistor 438 to an AFC diode 439 so as to control the frequency of the oscillator 326. When either of the switches 154 or 414 is closed, the AFC voltage at the terminal 398 returns to its no error value so that the AFC circuitry does not interfere with channel selection.

In FIGS. 20, 21 and 23 to 28, inclusive, a number of alternative arrangements are disclosed for automatically switching between VHF and UHF stations in alternate positions of the common selector shaft 42. Referring first to FIG. 20 a switching arrangement is shown therein which is particularly suitable for operation with a transistor RF amplifier of the common base type which has a low input impedance. More particularly in the embodiment of FIG. 20 the VHF input from the filter 312 is supplied through a feedthrough capacitor 440 and a series capacitor 442 to the stator contact 62c, so that the VHF input signal is applied across both of the input coils 320a, 322a to ground through the stator contacts 62a. The stator contact 62b which is connected to the junction of these two coils is then connected through a capacitor 444 to the emitter 446 of a transistor 448 which is operated in the common base configuration in which the base thereof is grounded through the feedthrough capacitor 450. The emitter 446 is connected through the feedthrough capacitor 452, a coil 454 and resistor 456 to ground. In VHF detent positions of the shaft 42 a ground is supplied from the stator contact 62a through the coil 320a, the stator contact 62b and the coil 324 to the base of the UHF oscillator, as described in detail heretofore in connection with the embodiment of FIG. 19, so that the UHF oscillator is prevented from oscillating during VHF reception. Also, the contact 60d on the tuning stick 58 depresses the switch contact 282 so that the member 282 and 290 are not connected together and no UHF IF signal path is provided to the input of the transistor 448. The capacitors 440, 442 and 452 in conjunction with the coils 320a, 322a function to tune the input of the transistor 448 to the desired VHF station.

When the shaft 42 is in a UHF detent position the UHF oscillator base is no longer grounded through the stator contact 62a and the members 282 and 290 are connected together so that an IF signal from the UHF tuner is supplied through a capacitor 458 to the emitter of the transistor 448, it being understood that this transistor is now operated as a 40-Mhz amplifier for UHF reception, as described in detail heretofore in connection with the embodiment of FIG. 19. In this respect the transistor 448 replaces the MOSFET 318 of FIG. 19. Preferably, transistor 448 is a bipolar transistor type BF 200, the capacitor 440 has a value of 20 picofarads, the capacitor 442 a value of 6 picofarads, the capacitor 452 a value of 3 picofarads and the capacitor 450 a value of 1,000 picofarads in the embodiment of FIG. 20.

In FIG. 21 an alternative arrangement is employed wherein a different cross bar structure is employed on the stator 64. This cross bar structure is shown in FIG. 22. In this figure the cross bar 280a is generally similar to the cross bar 280 but includes a tubular headed conductive member 460 which is mounted in the cross bar 280a adjacent the flat end portion 298 of the spring contact 282 in such manner that the member 460 is engaged by the end portion 298 when the spring 282 is depressed by engagement with one of the stick contacts 60d. In other respects the stator bar 280a of FIG. 22 is similar to that described in detail heretofore in connection with the FIGS. 15, 16 and 17.

Referring now to FIG. 21, the VHF input signal from the filter 312 is connected to the stator contacts 62b and the UHF oscillator base is grounded through the coil 324, as in the embodiment described in detail heretofore in connection with FIG. 19. However, an additional capacitor 462 is connected from the input electrode 338 of the MOSFET 318 to ground only during VHF reception. During VHF operation the RF device 318 must perform over a wide frequency range, this resulting in a variation of its input resistance which in turn affects the selectivity of the tuned circuit connected to it. By connecting the fixed capacitor 462 to the input of the device 318 during VHF reception the selectivity variation can be held to acceptable limits. This capacitor also stabilizes the circuit resonant frequency when the input capacity of the device 318 changes as when its gain is altered by application of AGC.

During UHF IF amplification, the selectivity and resonance of the input circuit of the device 318 is of secondary importance as the UHF tuner selectivity and the selectivity of transformer 354 combine to provide adequate overall RF/IF selectivity. At the same time the noise figure of the UHF tuner is appreciably influenced by the effectiveness of the IF signal transfer between the UHF diode mixer and the IF amplifier device 318. By disconnecting the capacitor 462 during UHF reception it is possible to secure an increase in the impendance of the input resonant circuit and consequently an increase in gain and decrease in noise figure by the use of large inductances.

When one of the tuning sticks 58 is connected to the stator contacts 62 the empty stick contact 60d depresses the spring member 282 so that it contacts the conductive stud 460 which is in turn connected to the capacitor 462. Accordingly, the capacitor 462, during VHF reception, is connected through the stud 460, the blade 282 and the capacitor 316 to the input of the MOSFET 318. However, during UHF reception the switch contact 282 is disconnected from the stud 460 so that the shunt capacitor 462 is no longer in the circuit while at the same time the UHF IF signal is connected from the member 290 through the blade 282 and the capacitor 316 to the input of the MOSFET 318 as described in detail heretofore in connection with FIG. 19. In other respects the operation of the embodiment of FIG. 21 is identical to that described in detail heretofore in connection with FIG. 19.

In the embodiment of FIG. 23, a cross bar 280a of the type shown in FIG. 22 is used. In this embodiment the VHF coil 320 is connected between the stick contacts 60b and 60c and the coil 322 is connected between the stator contacts 60c and 60d so that the stick contact 60d is no longer an empty contact but establishes electrical contact with the switch contact member 282 when a VHF tuning stick 58 is in operative position, as well as depressing the member 282 so that it contacts the conductive stud 460.

In the embodiment of FIG. 23 the VHF input is again connected to the junction of the coils 320 and 322 through the stator contact 62c as in the embodiment of FIG. 19. However, in order to provide a ground connection for the UHF oscillator base, a wire 464 is provided on the tuning stick 58 connecting the stick contacts 60a and 60b. Accordingly, when the tuning stick is in operative position the oscillator base is grounded through the coil 324 and the wire 464 to the grounded stator contact 62a.

During VHF reception the stick contact 60d establishes electrical connection with the switch blade 282 and supplies the VHF signal appearing at the upper end of the coil 322 through the capacitor 466 to the input electrode of the MOSFET 318. Also, in this position the blade 282 is physically depressed by engagement of the stick contact 60d therewith so that it is electrically connected to the conductive stud 460. A capacitor 468 is connected between the stud 460 and ground and hence the capacitor 468 is also connected in circuit with the input of the MOSFET 318 during VHF reception. By adding capacity to the input gate of the MOSFET 318 during VHF operation the performance can be improved as described heretofore in connection with FIG. 21.

However, during UHF reception when a tuning stick is no longer contacting the stator contacts 62 the blade 282 is removed from engagement with the stud 460 and is connected to the member 290 so that the capacitor 468 is out of the circuit when a UHF IF signal is applied through the members 290, 282 and the capacitor 466 to the input of the MOSFET 318. Removal of the capacitor 468 during UHF reception also improves operation as described heretofore.

Referring now to the embodiment of FIG. 24, in this embodiment the physical positions of the cross bar 280 and the stick contact 60c are interchanged on the stator bar 64, as indicated diagrammatically in FIG. 24. Accordingly, in this embodiment the stick contact 60c depresses the blade 282 durin VHF reception and disconnects this blade from the contact 290. The VHF input from the filter 312 is electrically connected to the blade 282 which is in turn connected through the stick contact 60c to the junction of the coils 320 and 322 for that particular VHF station. The stick contact 60b is connected through the stator contact 62b to ground and the upper end of the coil 322 is connected through the stator contact 62d and capacitors 470 and 472 to the input of the MOSFET 318. In the embodiment of FIG. 24 the UHF IF signal is not switched off during VHF reception but instead is directly connected through the matching coil 334 and the capacitor 472 to the input of the MOSFET 318. However, when the shaft 42 is in the alternate VHF detent positions the base of the UHF oscillator is grounded to the stat or contact 62b through a wire 474 which is connected between the stick contacts 60a and 60b, so that the UHF oscillator is prevented from oscillating during VHF reception. In the embodiment of FIG. 24 some difficulty may be experienced by virtue of the fact that The VHF signal can be transmitted back through the coil 334 to the crystal mixer in the UHF tuner 50 and produce cross modulation effects. In other respects the embodiment of FIG. 24 operate similarly to that described in detail heretofore in connection with FIG. 19.

In the embodiment of FIG. 25 a stator cross bar similar to the cross bar 280a shown in FIG. 22 is provided on the stator 64 in place of the first stator contact 62a and a second cross bar similar to the cross bar 280 is provided on the stator 64 after the next three stator contacts 62b, 62c and 62d. In the embodiment of FIG. 25 the VHF signal is supplied to the stator contacts 62c and the stator contact 62b is grounded so that the VHF input signal is applied across the coil 320 and the stepped up VHF signal appearing at the stator contact 62d is supplied to the capacitor 474 to the input of the MOSFET 318 during VHF reception. Also, during VHF reception the base of the UHF oscillator is grounded through the coil 324, the coil 320 and the stator contact 62b.

In the embodiment of FIG. 25 a further feature is provided whereby either the UHF IF signal, which is supplied to the terminal 330, or the VHF input signal which is applied to the terminal 476, is shorted to ground when the opposite type of signal is being received. Thus, during VHF reception the UHF IF signal applied to the terminal 330 is connected by way of the stud 460 and the flexible blade 282 to ground because the blade 282a is depressed by means of the empty rotor contact 60a, provided on the tuning stick 58 in the embodiment of FIG. 25. During UHF reception none of the tuning sticks 58 is in engagement with the spring members 282 and 282a or the stator contacts 62, and hence the VHF signal is connected to ground through the member 290a and flexible blade 282a. Also, the UHF IF signal is supplied through the terminal 290, the flexible blade 282 and the capacitor 458 to the input of the MOSFET 318. In the embodiment of FIG. 25 the UHF oscillator base is also grounded through the coil 324, the stator contact 62c, the coil 320 and the stator contact 62b, as described in detail heretofore. By directly shorting the UHF input or the VHF input, pickup from the opposite tuner, such as through the contacts 290, 282, is avoided.

In FIG. 26 a further alternative embodiment is disclosed wherein a pair of cross bars similar to the cross bar 280 described in detail heretofore in connection with FIGS. 15 to 17, are provided in place of the third and fourth stator contacts, the flexible blades 282 and 282a thereof being engaged by the rotor contacts 60c and 60d, respectively on the tuning sticks 58. In the embodiment of FIG. 26 the VHF tuning coil 320 is connected between the rotor contacts 60b and 60c and the coil 322 is connected between the rotor contacts 60c and 60d. Accordingly, during VHF reception the VHF signal is connected through the blade 282 and the rotor contact 60c to the junction of the coils 320, 322. The bottom end of the coil 320 is connected to ground through the stator contact 62b and the top end of the coil 322 is connected through the rotor contact 60d, the blade 282a and a capacitor 480 to the input of the MOSFET 318. Also, during UHF reception the UHF oscillator base is grounded through the coil 324 which is connected to the stator contacts 62a, through the rotor contact 60a and a wire 482 on the tuning stick, to the rotor contact 60b and through the stator contact 62b to ground. An independent ground connection for the UHF oscillator base is thus provided as in the embodiment of FIG. 23. However, during UHF reception, in the embodiment of FIG. 26 the VHF input is shorted to ground through the blade 282 and the terminal 290. At the same time the UHF IF signal is supplied through the coil 334, through the closed contacts 290a and 282a and through the capacitor 480 to the input of the MOSFET 318.

In the embodiment of FIG. 27 a stator crossbar 280a, as described in detail heretofore in connection with FIG. 22, is provided in place of the 4th stator contact. However, unlike the previously described embodiments the flexible blade 282 thereof is not depressed during VHF reception because no empty rotor contact 60d is provided on the tuning sticks 58 in the embodiment of FIG. 27. Accordingly, during VHF reception the flexible blade 282 is connected through the terminal 290 to ground so as to ground the IF output of the UHF tuner during VHF reception. Also, during VHF reception the VHF input signal is applied to the input of the MOSFET 318 and the UHF oscillator base is grounded in a manner substantially identical to that described in detail heretofore in connection with FIG. 19. However, in the embodiment of FIG. 27 an insulated disc 486 is mounted on the selector shaft 42 and is provided with a series of twelve projections 488 which are arranged to engage the blade 282 and depress it so that it is connected to the stud 460 in the twelve alternate UHF positions of the shaft 42. Thus, during UHF reception one of the projections 488 depresses the blade 282 so that it is connected to the contact 460 and the UHF IF signal is supplied through a capacitor 490 to the input of the MOSFET 318. In the intermediate VHF positions the projections 488 do not contact the switch blade 282 and hence the IF output from the UHF tuner 50 is connected to ground. It will be appreciated that the insulated disc 486 may be supported in any suitable manner for rotation with the shaft 42. For example, the disc 486 may be secured to the supporting disc 54 with the projections 488 thereof in alignment with the blade 282 on the cross bar 280.

In FIG. 28 an alternative embodiment is disclosed wherein the UHF oscillator is not prevented from oscillating by grounding the oscillator base but instead a B plus voltage for the UHF oscillator is selectively applied to this oscillator only during UHF positions of the shaft 42. Also, B plus is removed from the VHF oscillator in the UHF positions of the shaft 42. More particularly in the embodiment of FIG. 28 a cross bar 280 is arranged on the stator 64 so that the blade 282 thereof will be engaged by an empty rotor contact 60d on the tuning stick 58. During VHF reception the VHF input signal is applied from the terminal 476 to the junction of the coils 320 and 322 so that a VHF input signal is applied through the capacitor 314 to the input of the MOSFET 318. However, in the embodiment of FIG. 28 the UHF oscillator base is not grounded during VHF reception and the coil 324 is eliminated. During UHF reception the UHF IF signal is supplied by way of the terminal 290, the blade 282, and the capacitor 316 to the input of the MOSFET 318, as described in detail heretofore in connection with FIG. 19.

In the embodiment of FIG. 28 a cross bar similar to the cross bar 280 is provided in place of the stator contact 62i described heretofore in connection with FIG. 19, the blade 282a of this cross bar being depressed by the rotor contact 60i in the VHF positions of the shaft 42. Accordingly, during VHF reception a B plus voltage is supplied through the coil 384, the blade 282a, the rotor contact 60i, the oscillator tuning coil 246 on the tuning stick, the rotor contact 60j and the stator contact 62j to the oscillator tuning coil 376 so that B plus voltage is supplied to the collector of the oscillator transistor 374. During these periods of VHF reception the blade 282a is not connected to the terminal 290a because it is depressed by the rotor contact 60i during VHF reception. During UHF reception no rotor contact 60i is depressing the blade 282a, and this blade is connected through the terminal 290a to a UHF B plus output terminal 492 so that a B plus voltage is supplied to the UHF tuner 50 during periods of UHF reception. It will be noted that in the UHF positions of shaft 42 no B plus voltage is supplied to the collector of the VHF oscillator 374 since no connection is established to the stator contact 62j in these VHF positions.

Referring to FIGS. 29 to 32, inclusive, an alternative embodiment of the invention is disclosed wherein a different switching arrangement is employed to switch a suitable B plus potential between the VHF and UHF tuners automatically in accordance with the position of the common selector shaft 42.

Referring to these figures the stator contact 62i may be substantially as described heretofore. However, the last stator contact 502 on the stator bar 64a is relatively wide so as to permit the the stick contact 60j to engage the contact 502 at a point displaced from a fixed right-angled contact member 504 which is positioned in the stator bar by means of a shank portion 506 and is secured to the bar 64a by means of a twisted end portion 508.

In the VHF positions of the selector shaft 42 the rotor contact 60j engages the stator contact 502 and depresses the mid portion thereof so that the contact 502 does not engage the overhanging end portion of the fixed contact 504, as shown in FIGS. 29, 30 and 31. In these VHF positions a B plus potential which is connected to the bottom portion 510 of the stator contact 502 is supplied through the rotor contact 60j, the oscillator coil 246 wound on the stick 58, the rotor contact 60i and the stator contact 62i, to provide a suitable B plus potential to the VHF oscillator 374 as described heretofore.

However, in the UHF positions of the shaft 42 none of the rotor contacts of the sticks 58 engage the stator contracts 62i and 502. In these UHF positions, the stator contact 502 is bowed outwardly so that it engages and makes electrical contact with the overhanging arm portion of the contact 504. Accordingly, in the UHF positions of the shaft 42 and B plus potential is supplied through the stator contact 502 and the stator contact 504 to the UHF B plus terminal 492 so that a UHF potential is supplied to the UHF oscillator in the manner described in detail in connection with FIG. 28. It will be noted that with the arrangement of FIGS. 29 to 32 an extremely compact structure is provided which is situated solely on the rotor 64a and wherein the switchable contact is provided by the flexibility of the stator contact 502 itself.

While there have been illustrated and described various embodiments of the present invention, it will be apparent that various changes and modifications thereof will occur to those skilled in the art. It is intended in the appended claims to cover all such changes and modifications as fall within the true spirit and scope of the present invention.

What is claimed as new and desired to be secured by Letters Patent of the United States is:

1. A television tuner arrangement for receiving both VHF and UHF television signals comprising, a VHF tuner having a main tuning shaft, detent means for establishing an even number of equally spaced detent positions for said main tuning shaft, said VHF tuner including a fixed stator member carrying a plurality of stator contacts, means carried by said main tuning shaft for supporting a plurality of VHF tuning panels each of which includes a plurality of tuning coils which are connected to said stator contacts in alternate detent positions of said main tuning shaft, an oscillator coil on each of said VHF tuning panels which is connected between first and second contacts carried thereby, a conductive switching member secured to said stator member and movable from a first to a second position by engagement of one of said first panel contacts therewith in said alternate detent positions of said main tuning shaft, a VHF oscillator in said VHF tuner, means including said movable switching member for supplying an enabling potential to said VHF oscillator in said alternate detent positions of said main tuning shaft, a UHF tuner having a continuously variable rotor shaft rotation of which is effective selectively to receive all of the seventy UHF stations, means interconnecting said main tuning shaft and said rotor shaft so that said rotor shaft is moved a distance equal to the width of one UHF channel when said main tuning shaft is moved a predetermined number of detent positions, a fixed switching member connected to said movable switching member when said movable member is in said first position, and means including said fixed switching member for supplying an enabling potential to said UHF tuner when said main tuning shaft is positioned between said alternate detent positions.

2. The combination of claim 1, which includes a source of unidirectional potential connected to said movable switching member, said source of potential being connected to said VHF oscillator through said movable switching member, said first and second panel contacts, said oscillator coil and one of said stator contacts in said alternate positions of said main tuning shaft.

3. The combination of claim 2, wherein said source of unidirectional potential is connected through said movable switching member and said fixed switching member to said UHF tuner in the detent positions of said main tuning shaft between said alternate detent positions.

4. A television tuner arrangement for receiving both VHF and UHF television signals comprising, a VHF tuner having a main tuning shaft, detent means for establishing an even number of equally spaced detent positions for said main tuning shaft, said VHF tuner including a fixed stator member carrying a plurality of stator contacts and means carried by said main tuning shaft for supporting a plurality of VHF tuning panels each of which includes a plurality of tuning coils which are connected to said stator contacts in alternate detent positions of said main tuning shaft, a movable switching member positioned on said stator member, a first fixed contact on said stator member and electrically connected to said movable member when said main tuning shaft is in detent positions between said alternate detent positions, a second fixed contact on said stator member, means on each of said VHF tuning panels for moving said movable switching member out of contact with said first fixed contact and into engagement with said second fixed contact when the tuning coils thereof are connected to said stator contacts, a UHF tuner having an IF output conductor connected to said first fixed contact, means connecting said movable switching member to the input of said VHF tuner so that an IF signal from said UHF tuner is supplied to said VHF input when said main tuning shaft is in detent positions between said alternate detent positions, and capacitive means connected to said second fixed contact, said capacitive means being connected to said VHF input through said second fixed contact and said movable switching member when said main tuning shaft is in said alternate detent positions.

5. A television tuner arrangement for receiving both VHF and UHF television signals comprising, a VHF tuner having a main tuning shaft, detent means for establishing an even number of equally spaced detent positions for said main tuning shaft, said VHF tuner including a fixed stator member carrying a plurality of stator contacts and means carried by said main tuning shaft for supporting a plurality of VHF tuning panels each of which includes a plurality of tuning coils which are connected to said stator contacts in alternate detent positions of said main tuning shaft, a movable switching member positioned on said stator member, a first fixed contact on said stator member and electrically connected to said movable member when said main tuning shaft is in said alternate detent positions, a UHF tuner having an IF output conductor connected to said movable switching member, means connecting said first fixed contact to ground, whereby said IF output conductor is connected to ground in said alternate detent positions, a second fixed contact on said stator member and connected to the input of said VHF tuner, and insulating means carried by said main tuning shaft for moving said movable switching member out of contact with said first fixed contact and into engagement with said second fixed contact when said main tuning shaft is in detent positions between said alternate detent positions.

6. A television tuner arrangement for receiving both VHF and UHF television signals comprising, a VHF tuner having a main tuning shaft, detent means for establishing an even number of equally spaced detent positions for said main tuning shaft, said VHF tuner including a fixed stator member carrying a plurality of stator contacts and means carried by said main tuning shaft for supporting a plurality of VHF tuning panels each of which includes a plurality of tuning coils which are connected to said stator contacts in alternate detent positions of said main tuning shaft, a movable switching member positioned on said stator member, a first fixed contact on said stator member and electrically connected to said movable member when said main tuning shaft is in detent positions between said alternate detent positions, a second fixed contact on said stator member, means on each of said VHF tuning panels for moving said movable switching member out of contact with said first fixed contact and into engagement with said second fixed contact when the tuning coils thereof are connected to said stator contacts, a UHF tuner having an IF output conductor connected to said second fixed contact, means connecting said movable switching member to ground so that said IF output conductor is connected to ground through said movable switching member when said main tuning shaft is in said alternate detent positions, and a VHF antenna circuit having an output terminal connected to said first fixed contact, whereby said VHF antenna circuit is connected to ground through said movable switching member when said main tuning shaft is in detent positions between said alternate detent positions.

7. A television tuner arrangement for receiving both VHF and UHF television signals comprising, a VHF tuner having a main tuning shaft, detent means for establishing an even number of equally spaced detent positions for said main tuning shaft, said VHF tuner including a fixed stator member and means carried by said main tuning shaft for supporting a plurality of VHF panels each of which includes a VHF input coil connected to a conductive contact on said panel, a movable switching member positioned on said stator member, a fixed contact on said stator member and electrically connected to said movable member when said main tuning shaft is in alternate ones of said detent positions, a UHF tuner having an IF output conductor connected to said fixed contact, and a VHF input circuit connected to said movable member, whereby said IF output is connected to said VHF input circuit in said alternate detent positions, said conductive contact on each of said panels being positioned to move said movable switching member out of engagement with said fixed contact when said main tuning shaft is in said detent positions between alternate detent positions to disconnect said IF output from said VHF input circuit while at the same time connecting said VHF input coil to said VHF input circuit.

8. The combination of claim 7, which includes a second fixed contact on said stator member which is electrically connected to said movable member in said alternate detent positions, and capacitive means connected between said second fixed contact and ground.

9. A television tuner arrangement for receiving both VHF and UHF television signals comprising, a VHF tuner having a main tuning shaft, detent means for establishing an even number of equally spaced detent positions for said main tuning shaft, said VHF tuner having tuning means effective in alternate detent positions of said main tuning shaft selectively to receive different VHF stations, a UHF tuner having a continuously variable rotor shaft rotation of which is effective selectively to receive all of the seventy UHF stations, means interconnecting said main tuning shaft and said rotor shaft and having a step-down ratio such that said rotor shaft is moved a distance equal to the width of one UHF channel when said main tuning shaft is moved a predetermined number of detent positions, said UHF tuner having an IF output conductor, said VHF tuner including a fixed stator member carrying a plurality of stator contacts and means carried by said main tuning shaft for supporting a plurality of VHF tuning panels having contacts adapted to engage said stator contacts in said alternate detent positions, a switching means supported on said stator member and having a pair of contacts which are closed in said other detent positions of said main tuning shaft, means including said switching contacts for connecting said IF output conductor to the input of said VHF tuner means, each of said tuning panels having a switch actuating member which is effective when the tuning panel is connected to said stator contacts to open said pair of contacts of said switching means, thereby to disconnect said IF output conductor from the input of said VHF tuner means in said alternate detent positions of said main tuning shaft.

10. The tuner arrangement of claim 9, which includes tuning means permanently connected to said stator contacts for tuning said VHF tuner to the IF frequency of said UHF tuner when said main tuning shaft is in said other detent positions.

11. The tuner arrangement of claim 10, wherein each of said VHF tuning panels includes tuning means which is effective to tune said VHF tuner to a predetermined VHF station when connected in circuit with said permanently connected tuning means through said stator contacts.

* * * * *